(12) United States Patent
Akiba et al.

(10) Patent No.: US 8,298,963 B2
(45) Date of Patent: Oct. 30, 2012

(54) SEMICONDUCTOR DEVICE AND MANUFACTURING METHOD OF THE SAME

(75) Inventors: Toshihiko Akiba, Tokyo (JP); Minoru Kimura, Tokyo (JP); Masao Odagiri, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 354 days.

(21) Appl. No.: 12/690,733

(22) Filed: Jan. 20, 2010

(65) Prior Publication Data

US 2010/0181681 A1    Jul. 22, 2010

(30) Foreign Application Priority Data

Jan. 22, 2009    (JP) .................................. 2009-011570

(51) Int. Cl.
*H01L 23/522*    (2006.01)
(52) U.S. Cl. ................ 438/773; 257/E21.237; 257/773; 438/113; 438/460
(58) Field of Classification Search .................. 257/773, 257/E21.237; 438/46, 113, 460
See application file for complete search history.

(56) References Cited

U.S. PATENT DOCUMENTS

2005/0140006 A1 *  6/2005  Takahashi .................... 257/738
2007/0173035 A1    7/2007  Izumi

FOREIGN PATENT DOCUMENTS

| JP | 2005-191436 A | 7/2005 |
| JP | 2007-194469 A | 8/2007 |
| JP | 2008-055519 A | 3/2008 |

* cited by examiner

*Primary Examiner* — Matthew W Such
*Assistant Examiner* — Krista Soderholm
(74) *Attorney, Agent, or Firm* — Miles & Stockbridge P.C.

(57) ABSTRACT

With a recent shrinking semiconductor process, insulating layers formed between interconnect layers are becoming thin. To avoid parasitic capacitance between them, materials of a low dielectric constant have been used for an insulating layer in a multilevel interconnect. Low-k materials, however, have low strength compared with the conventional insulating layers. Porous low-k materials are structurally fragile. The invention therefore provides a manufacturing method of a semiconductor device having a multilevel interconnect layer including a low-k layer. According to the method, in a two-step cutting system dicing in which after formation of a groove in a semiconductor wafer with a tapered blade, the groove is divided with a straight blade thinner than the groove width, the multilevel interconnect layer portion is cut while being covered with a tapered face and then the wafer is separated with a thin blade which is not brought into contact with the multilevel interconnect layer portion. The wafer can be diced without damaging a relatively fragile low-k layer.

16 Claims, 28 Drawing Sheets

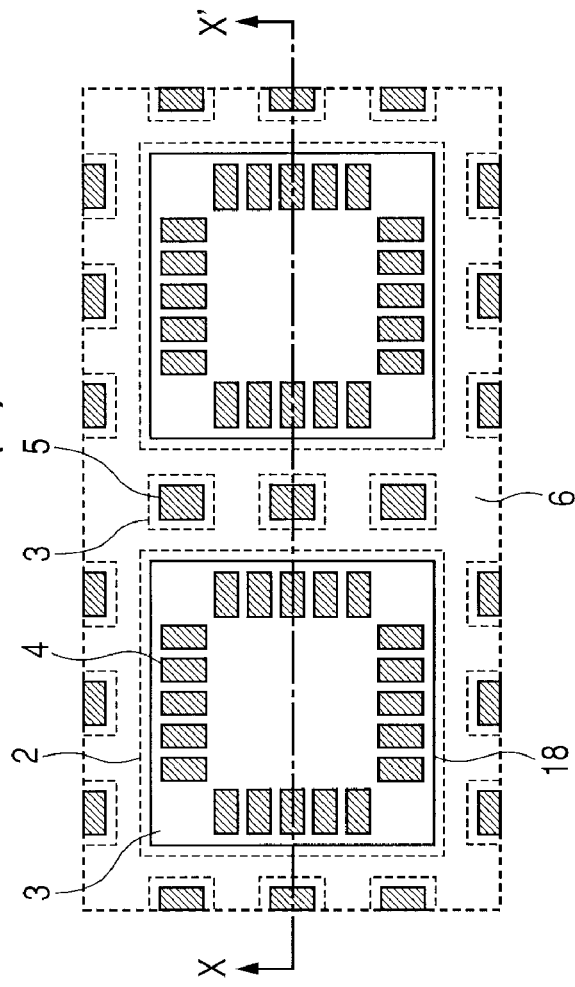
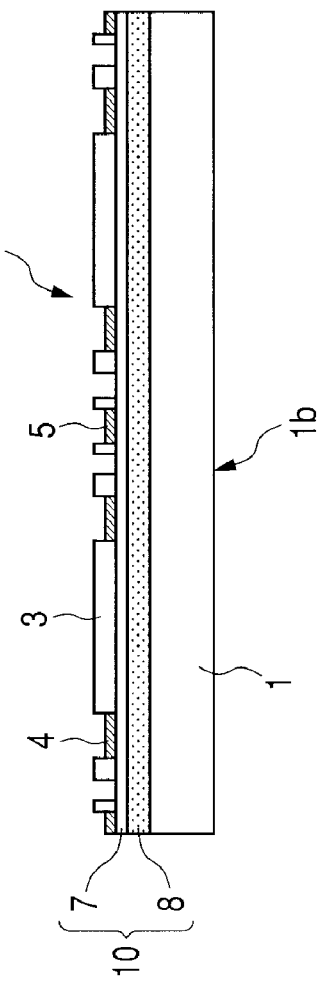
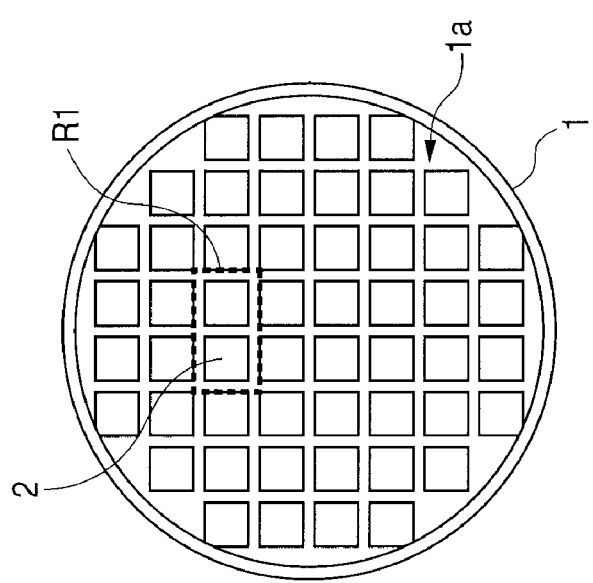

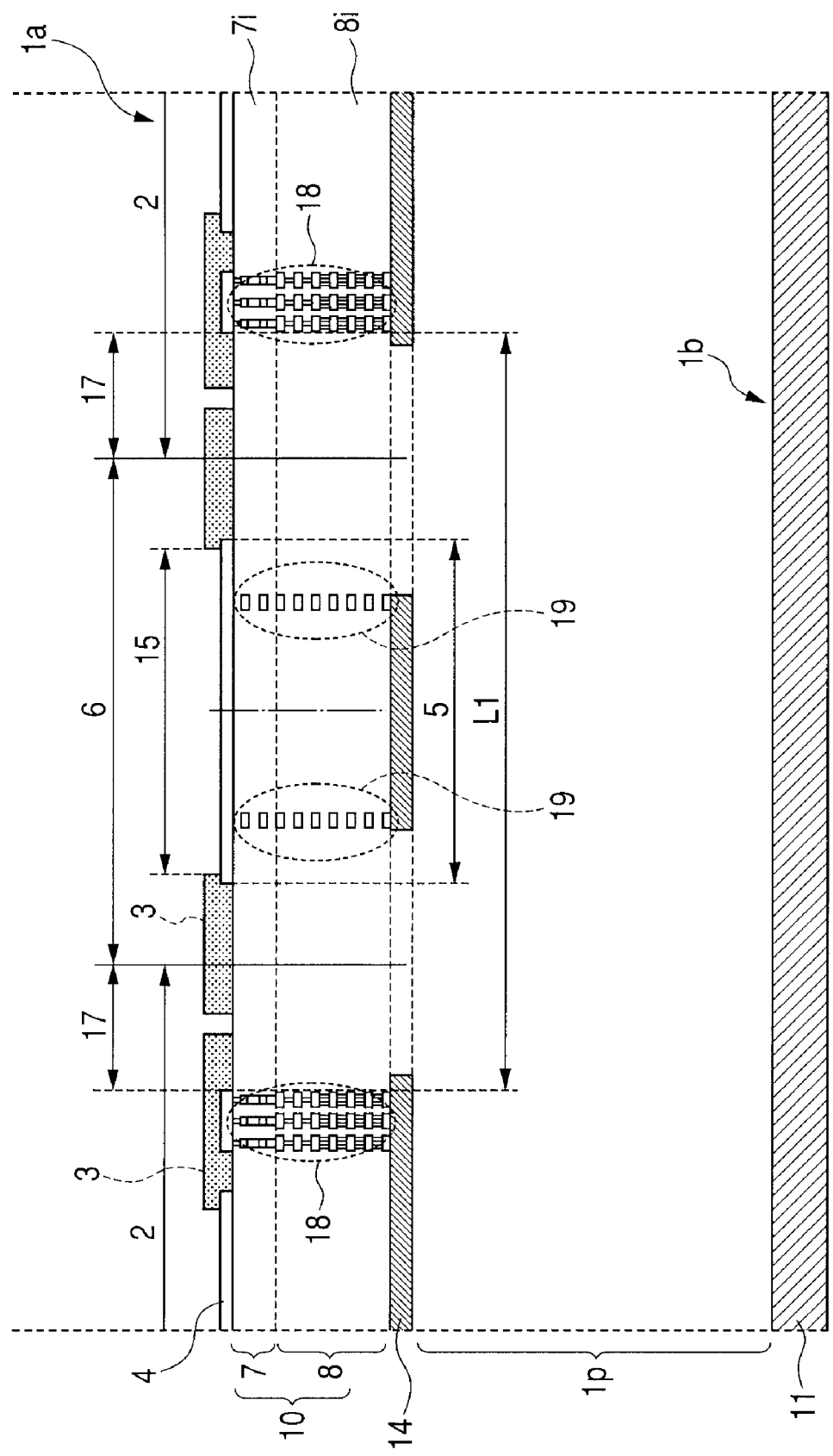

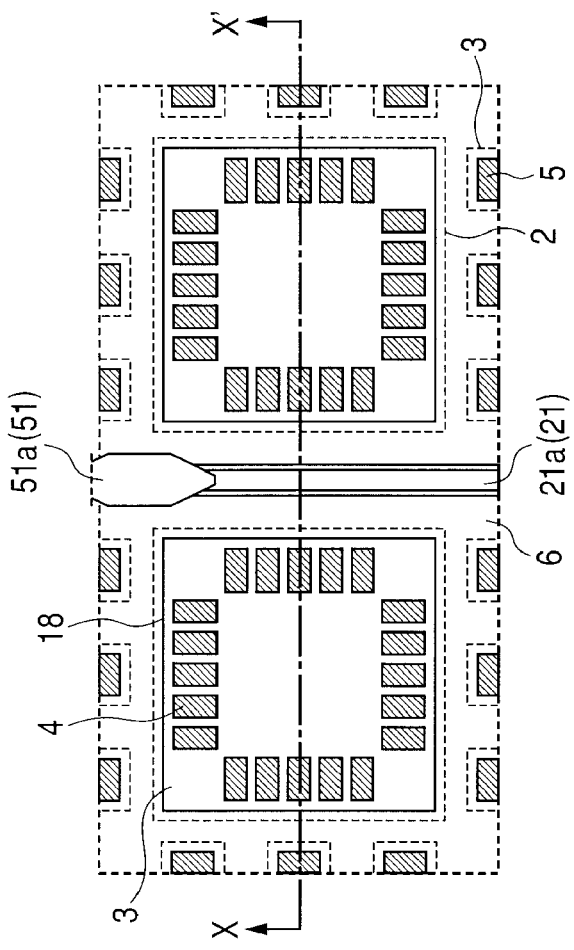
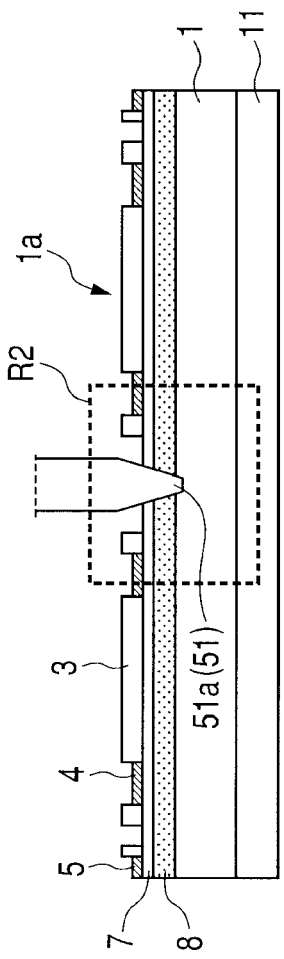
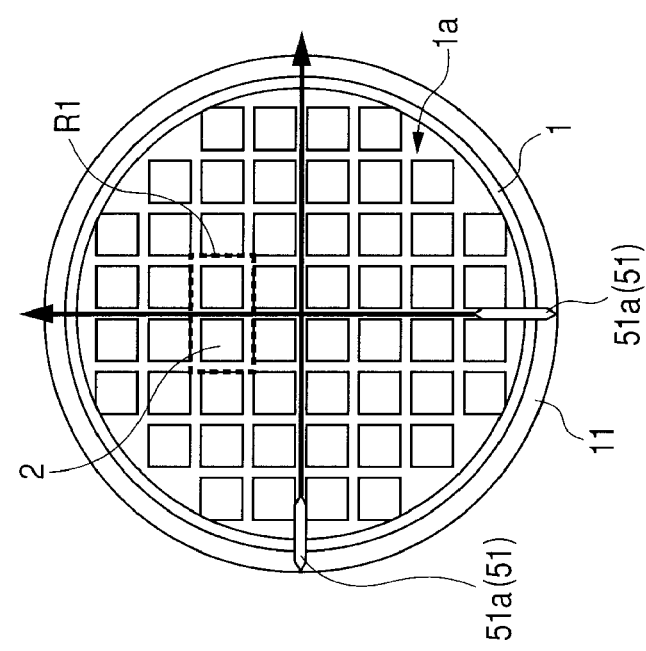

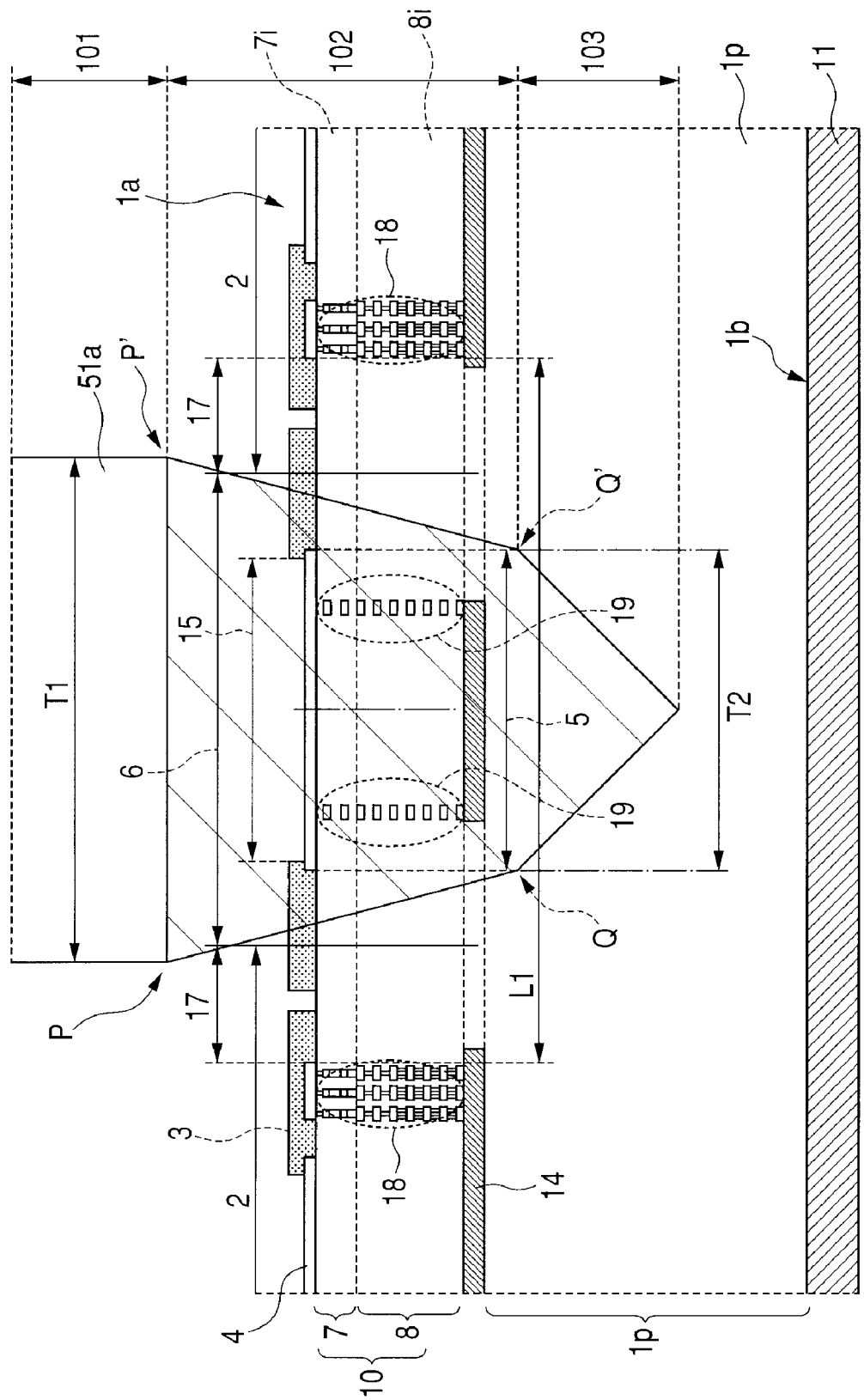

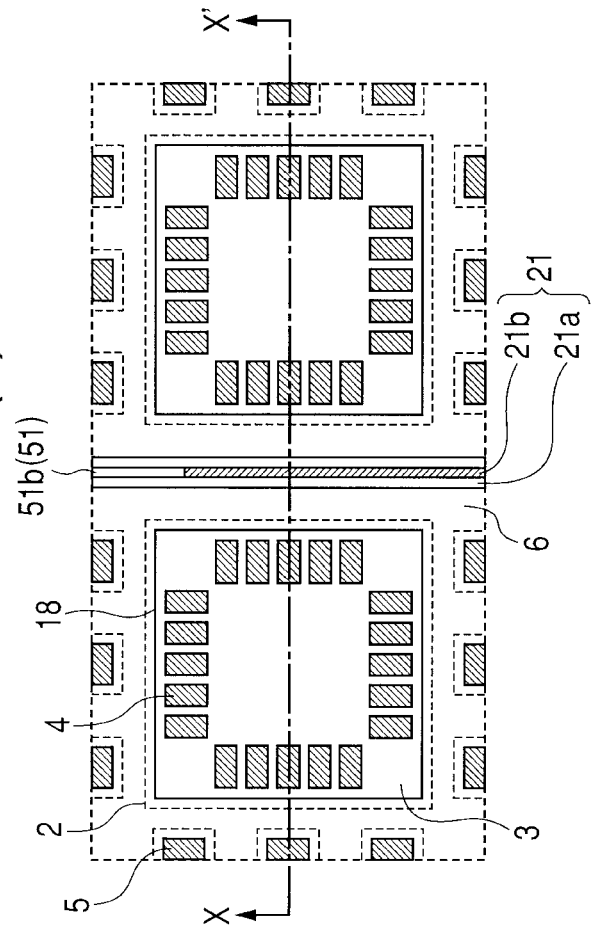
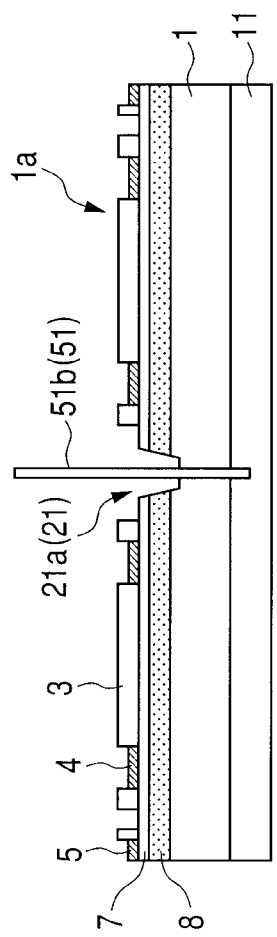
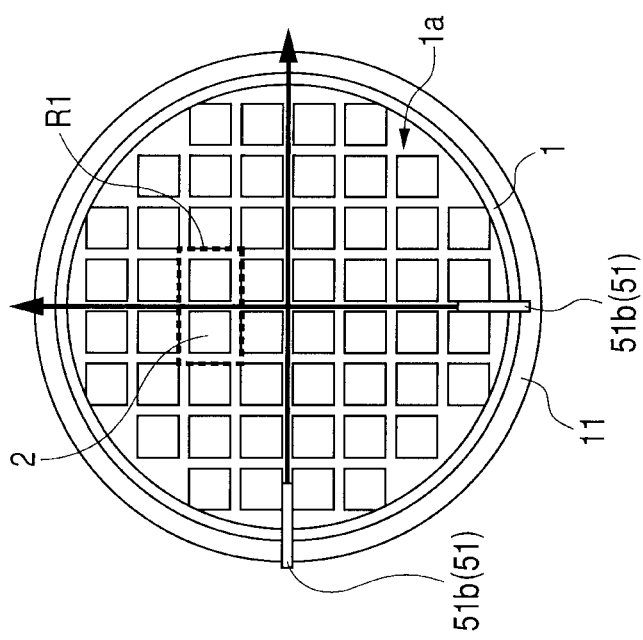

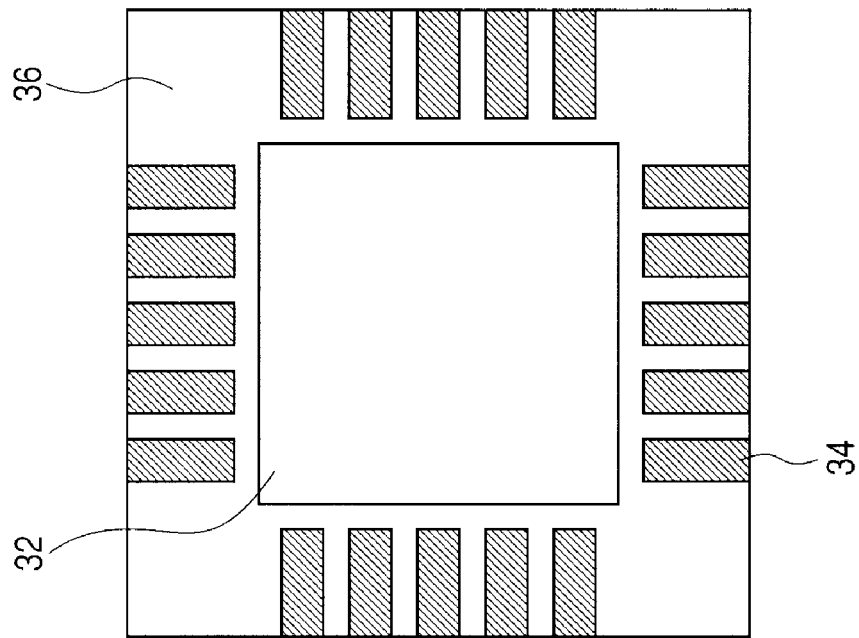
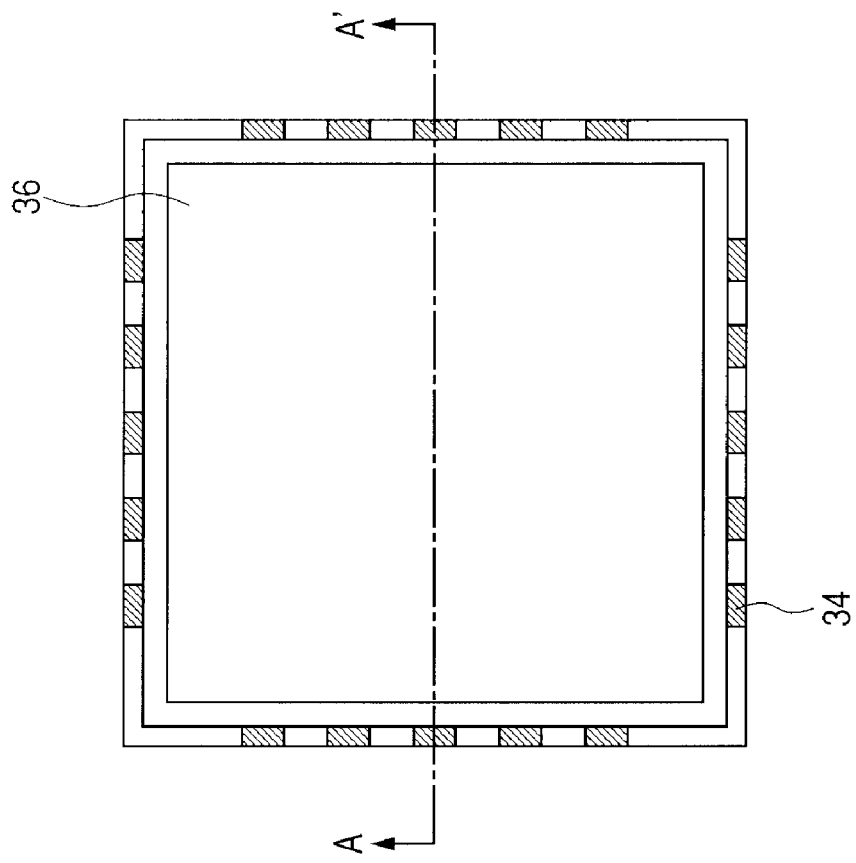

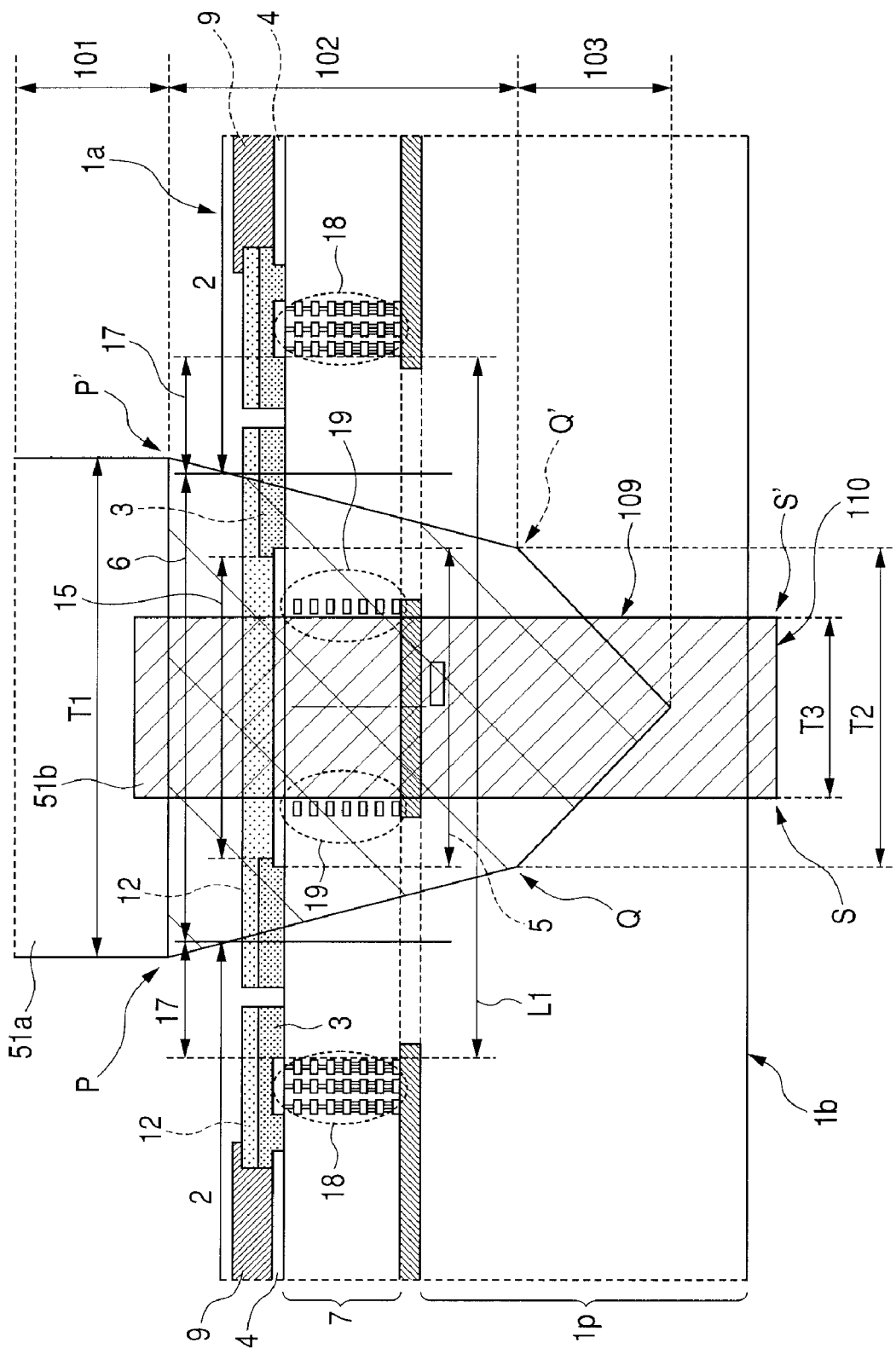

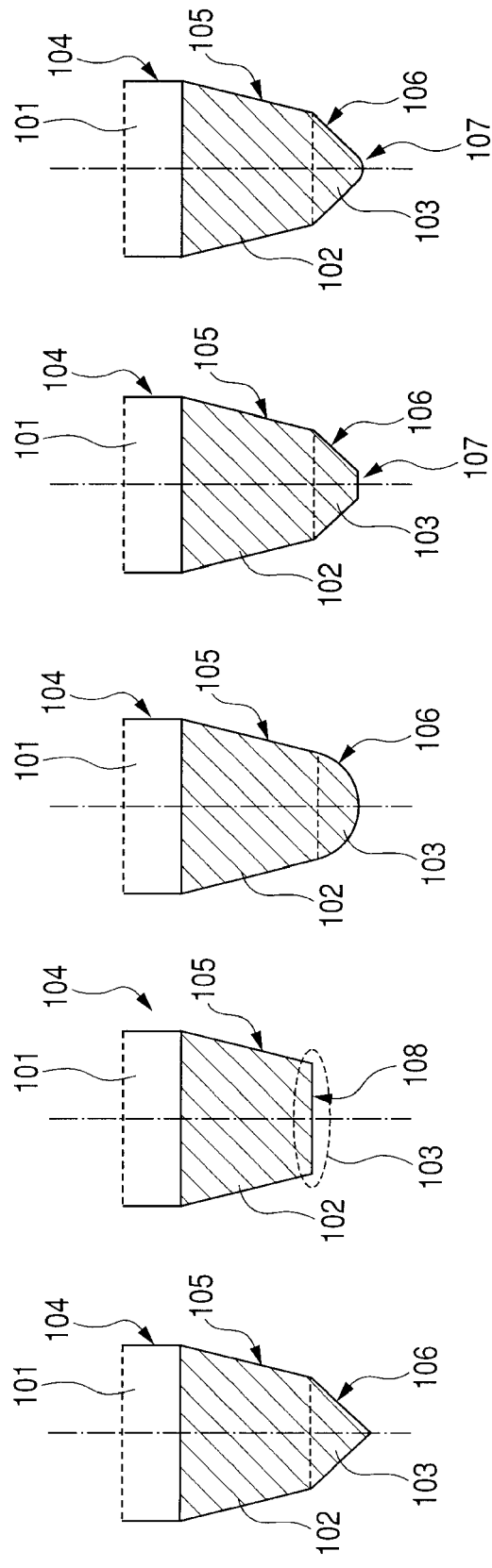

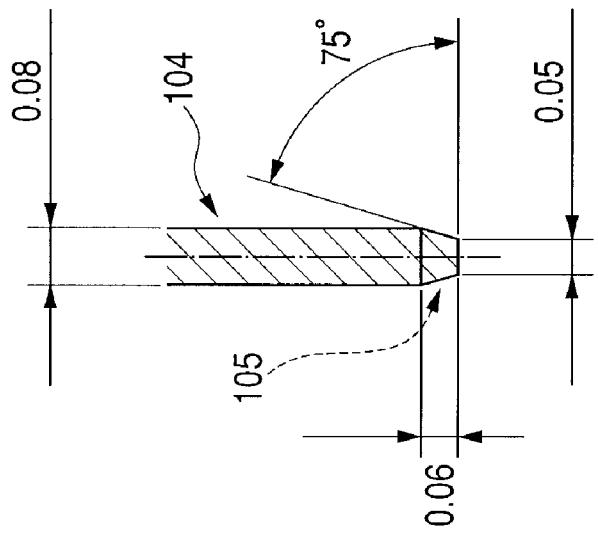
FIG. 22(b) OPTIMUM MINIMUM COMPLEMENTARY ANGLE OF INCLINATION & WIDTH OF OUTER RING PORTION
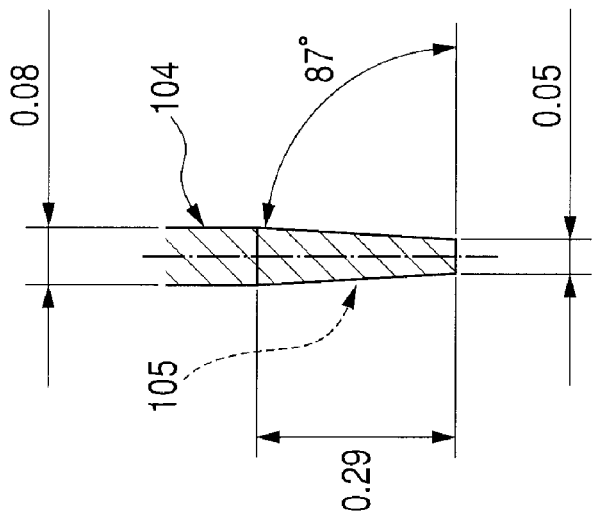
FIG. 22(a) OPTIMUM MAXIMUM COMPLEMENTARY ANGLE OF INCLINATION & WIDTH OF OUTER RING PORTION

OPTIMUM MAXIMUM COMPLEMENTARY ANGLE OF INCLINATION & WIDTH OF OUTER RING PORTION

OPTIMUM MINIMUM COMPLEMENTARY ANGLE OF INCLINATION & WIDTH OF OUTER RING PORTION

OPTIMUM MAXIMUM COMPLEMENTARY ANGLE OF INCLINATION & WIDTH OF OUTER RING PORTION

OPTIMUM MINIMUM COMPLEMENTARY ANGLE OF INCLINATION & WIDTH OF OUTER RING PORTION

SEMICONDUCTOR DEVICE AND MANUFACTURING METHOD OF THE SAME

CROSS-REFERENCE TO RELATED APPLICATIONS

The disclosure of Japanese Patent Application No. 2009-11570 filed on Jan. 22, 2009 including the specification, drawings and abstract is incorporated herein by reference in its entirety.

BACKGROUND OF THE INVENTION

The present invention relates to the structure of a semiconductor device (or a semiconductor integrated circuit device) or a technology effective when applied to a dicing technology in a manufacturing method of a semiconductor device (or a semiconductor integrated circuit device).

Japanese Unexamined Patent Publication No. 2008-55519 (Patent Document 1) discloses a technology of cutting an optical IC structure, which has been obtained by attaching a relatively soft prism layer comprised of an optical glass onto an optical IC substrate comprised of a relatively hard silicon material, with a rotary blade so as not to make cracks in the structure. Described specifically, according to this technology, a portion of the upper prism layer is cut with a wide-width first blade and then the remaining portion of the upper prism layer and the lower optical IC substrate are cut across the whole thickness with a small-width second blade, thus avoiding any burden on the blades.

Japanese Unexamined Patent Publication No. 2007-194469 (Patent Document 2) and Japanese Unexamined Patent Publication No. 2005-191436 (Patent Document 3) disclose a two-step dicing technology of a semiconductor wafer comprising forming a groove with a tapered blade and then, dicing the wafer with a straight blade having a smaller width than the tapered blade.
[Patent Document 1]
Japanese Unexamined Patent Publication No. 2008-55519
[Patent Document 2]
Japanese Unexamined Patent Publication No. 2007-194469
[Patent Document 3]
Japanese Unexamined Patent Publication No. 2005-191436

SUMMARY OF THE INVENTION

In recent years, due to the shrinking semiconductor process, the interconnect design rule or the thickness of insulating layers formed between interconnect layers tend to be smaller. In order to prevent parasitic capacitance between interconnect layers, materials having a low dielectric constant (low-k materials, that is, materials having a dielectric constant of 3.0 or less) have become popular as materials of an insulating layer in multilevel interconnect.

Low-k materials contain much carbon and the like for reducing their dielectric constant so that these materials themselves have low strength compared with materials constituting conventional insulating layers (non-low-k materials, that is, materials having a dielectric constant exceeding 3.0). Porous low-k materials, on the other hand, have a more fragile structure than materials constituting insulating layers of a conventional structure (non-porous materials) because insulating layers comprised of the porous low-k materials have therein many clearances (voids).

The present inventors have found that when a semiconductor wafer having such a low-k material is diced with a dicing blade (so-called straight blade) having an angle (angle of inclination) of approximately 90° between the side face and the face (cutting face) at the tip portion to be brought into contact with the semiconductor wafer, the following problems occur.

When the dicing blade is brought into contact with the surface (main surface) of the semiconductor wafer, the whole cutting face of the dicing blade is brought into contact with the semiconductor wafer as illustrated in FIG. 27. A large cutting stress (contact resistance) therefore occurs in this contact region. When the dicing blade reaches a low-k layer under such a state as illustrated in FIG. 28, a large cutting stress occurs also in the contact region between the low-k layer and the face at the tip portion of the dicing blade. The present inventors have therefore found that due to the influence of this cutting stress, cracks occur in the fragile low-k layer.

The present inventors have also found that when the dicing blade has a side face in a perpendicular direction to the surface (main surface) of the semiconductor wafer, a large cutting stress occurs also in a contact region between the low-k layer and the side face of the dicing blade during insertion of the dicing blade into the semiconductor wafer, which may easily cause cracks in the low-k layer.

Thus, when cracks appear in the low-k layer, they may presumably propagate even into a device region adjacent to a dicing region and deteriorate the reliability of the semiconductor device.

It is to be noted that Japanese Unexamined Patent Publication No. 2008-55519 (Patent Document 1) does not include a particular description on the positional relationship between a dicing blade and a low-k layer as described above during a dicing step. Even if this technology is applied, it is difficult to cut a semiconductor wafer having a low-k layer while suppressing generation of cracks.

With a view to overcoming such a problem, the present inventors have studied a dicing step performed with a dicing blade (so-called bevel blade) having, at the tip portion thereof, a taper as illustrated in FIG. 29.

When the dicing blade is brought into contact with the surface (main surface) of the semiconductor wafer, employing such a structure enables to limit the contact between a dicing blade and the surface of the semiconductor wafer to only a contact between a portion of the cutting face of the dicing blade and the surface (main surface) of the semiconductor wafer. In short, employing such a structure enables to reduce a contact region between the dicing blade and the semiconductor wafer. As a result, a cutting stress generated when the dicing blade is inserted into the semiconductor wafer can be reduced so that cracks can be suppressed even if the dicing blade reaches a low-k layer.

The dicing blade as illustrated in FIG. 29, however, cannot cut the semiconductor wafer to a predetermined depth due to a high wear frequency of the tip portion. When a dicing blade having a worn tip portion and a dicing blade having an unworn tip portion are inserted into the same depth, the width cut with the former one becomes greater than that cut with the latter one. In the former case, therefore, frequent replacement with a new dicing blade is required. The condition (position of the dicing blade) in a dicing apparatus must be reset whenever the dicing blade is replaced with a new one, which reduces manufacturing TAT.

The present invention has been made to overcome the above-described problems.

One of the objects of the invention is to suppress occurrence of cracks in a semiconductor wafer having a low-k layer (improvement in cutting property).

Another object of the invention is to ensure reliability of the semiconductor device.

A further object of the invention is to improve the life of a dicing blade.

The above-described and other objects and novel features of the invention will be apparent from the description herein and accompanying drawings.

The outline of the typical inventions disclosed herein will next be described briefly.

In a manufacturing method of a semiconductor device having a multilevel interconnect layer containing a low-k layer, a semiconductor wafer is subjected to a step cut dicing treatment in which a groove is formed with a tapered blade (first dicing blade) and then the resulting groove is divided with a straight blade (second dicing blade) thinner than the width of the groove. The cross-sectional shape in the radial direction of the tapered blade has a multi-step tapered structure substantially symmetrical with respect to the thickness direction, in which an angle of inclination becomes greater towards the tip portion of the blade. When viewed from the center of rotation, the upper end of the first tapered face is outside the main surface of the device. A dicing groove is formed by cutting the device while causing the lower end of the first tapered face to penetrate into the substrate region of the wafer or in the base material layer. Then, the wafer is divided by cutting the dicing groove portion corresponding to a portion between a pair of these lower ends with a straight blade.

The advantages available by the typical invention disclosed herein will next be described briefly.

In the manufacturing method of a semiconductor device having a multi-level interconnect layer containing a low-k layer, when a semiconductor wafer is subjected to a step cut dicing treatment in which a groove is formed with a tapered blade (first dicing blade) and then, the groove is divided with a straight blade (second dicing blade) having a blade width smaller than the width of the groove, the multi-level interconnect layer portion is cut while being covered with a tapered face and then, the wafer is separated with the blade that has a small blade width and is not contiguous to that portion so that dicing is performed without give damage to a relatively fragile low-k layer.

BRIEF DESCRIPTION OF DRAWINGS

FIGS. 1(a), 1(b), and 1(c) are explanatory views illustrating a processing flow of a dicing process in a manufacturing method of a semiconductor device according to one embodiment of the invention, in which FIG. 1(a) is an overall top view of the wafer, FIG. 1(b) is a top view of two chip regions, and FIG. 1(c) is a cross-sectional view taken along X-X' of FIG. 1(b) (before attachment to a dicing tape);

FIGS. 2(a), 2(b), and 2(c) are explanatory views illustrating a processing flow of a dicing process in the manufacturing method of a semiconductor device according to the one embodiment of the invention, in which FIG. 2(a) is an overall top view of the wafer, FIG. 2(b) is a top view of two chip regions, and FIG. 2(c) is a cross-sectional view taken along X-X' of FIG. 2(b) (after attachment to a dicing tape);

FIG. 3 is an enlarged cross-sectional view of the broken line portion R2 (the periphery of the chips and the region between the chips) of FIG. 2(c);

FIGS. 4(a), 4(b), and 4(c) are explanatory views illustrating a processing flow of a dicing process in the manufacturing method of a semiconductor device according to the one embodiment of the invention, in which FIG. 4(a) is an overall top view of the wafer, FIG. 4(b) is a top view of two chip regions, and FIG. 4(c) is a cross-sectional view taken along X-X' of FIG. 4(b) (during dicing with a first blade);

FIG. 5 is an enlarged cross-sectional view of the broken line portion R2 (the periphery of the chips and the region between the chips) of FIG. 4(c);

FIGS. 7(a), 7(b), and 7(c) are explanatory views illustrating a processing flow of a dicing process in the manufacturing method of a semiconductor device according to the one embodiment of the invention, in which FIG. 7(a) is an overall top view of the wafer, FIG. 7(b) is a top view of two chip regions, and FIG. 7(c) is a cross-sectional view taken along X-X' of FIG. 7(b) (during dicing with a second blade);

FIGS. 11(a) and 11(b) are explanatory views of a processing flow of a fabrication process in the manufacturing method of a semiconductor integrated circuit device according to the one embodiment of the invention, in which FIG. 11(a) illustrates the upper surface of a lead frame unit region and FIG. 11(b) is a cross-sectional view taken along A-A' of FIG. 11(a) (before die bonding);

FIGS. 12(a) and 12(b) are explanatory views of a processing flow of the fabrication process in the manufacturing method of a semiconductor integrated circuit device according to the one embodiment of the invention, in which FIG. 12(a) illustrates the upper surface of a lead frame unit region and FIG. 12(b) is a cross-sectional view taken along A-A' of FIG. 12(a) (die bonding step);

FIGS. 13(a) and 13(b) are explanatory view of a processing flow in the fabrication process in the manufacturing method of a semiconductor integrated circuit device according to the one embodiment of the invention, in which FIG. 13(a) illustrates the upper surface of a lead frame unit region and FIG. 13(b) is a cross-sectional view taken along line A-A' of FIG. 13(a) (wire bonding step);

FIGS. 15(a) and 15(b) are explanatory views of a processing flow of the fabrication process in the manufacturing method of a semiconductor integrated circuit device according to the one embodiment of the invention, in which FIG. 15(a) illustrates the upper surface of a sealed unit device and FIG. 15(b) illustrates the lower surface of the same device) (after completion of the sealing step and separation step);

FIGS. 17(a) and 17(b) are explanatory views of a dicing apparatus to be used in the manufacturing method of a semiconductor integrated circuit device according to the one embodiment of the invention, in which FIG. 17(a) illustrates the front view from the rotation axis direction of a spindle and FIG. 17(b) is a cross-sectional view taken along Y-Y' of FIG. 17(a);

FIG. 20 illustrates a modification example 2 (example of cutting polyimide coating) of the dicing processes ("fundamental dicing processes"+the modification example 1) illustrated in FIGS. 1 to 10;

FIGS. 21(a), 21(b), 21(c), 21(d), and 21(e) are cross-sectional views of a blade portion illustrating variations of a cross-sectional shape in the radial direction of a tapered dicing blade to be used in the dicing processes (each of the dicing processes) illustrated in FIGS. 1 to 10, FIG. 19, and FIG. 20, in which FIG. 21(a) is a steep-inclination taper inserted type, FIG. 21(b) is a tip flat type, and FIGS. 21(c), 21(d), and 21(e) are tip-portion beveled types in which FIG. 21(c) is a roundly beveled type, FIG. 21(d) is a flat beveled type, and FIG. 21(e) is a tip roundly beveled type;

FIGS. 22(a) and 22(b) are cross-sectional views illustrating the particularly preferred range of the maximum size and maximum angle of inclination and the particularly preferred range of the minimum size and minimum angle of inclination of the blade cross-sectional structure illustrated in FIG. 21(b), respectively;

FIG. 26(a) is a schematic front view of a dicing step for describing the cross-sectional structure and dicing action of a tapered dicing blade to be used in each dicing process of the invention, while

DETAILED DESCRIPTION OF THE INVENTION

Figure 2B:
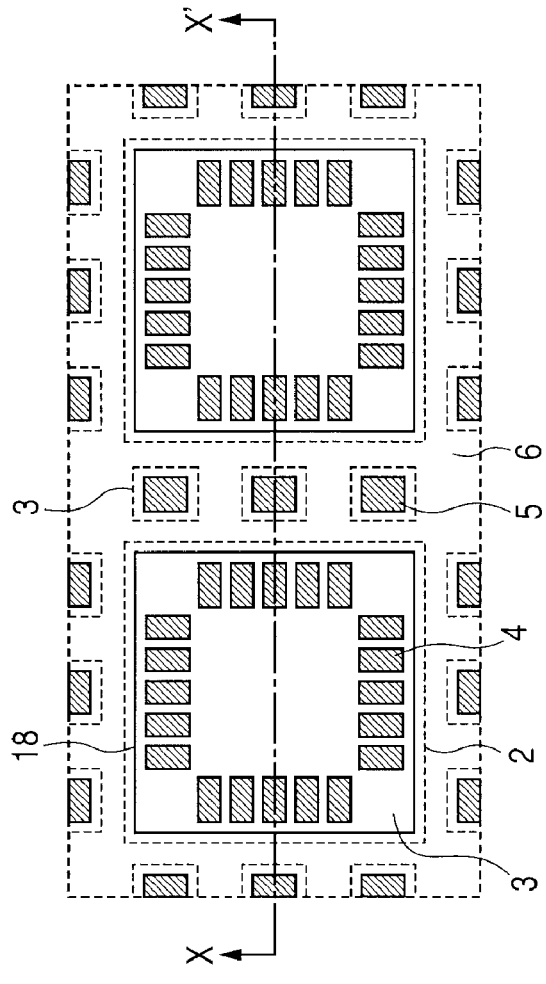

[Outline of Embodiments] First, the outline of typical embodiments of the invention disclosed herein will be described.

1. A manufacturing method of a semiconductor device comprising the steps of: (a) preparing a semiconductor wafer having a main surface, a plurality of device regions formed over the main surface, a dicing region formed between the device regions, and a back surface on a side opposite to the main surface; (b) in the dicing region of the semiconductor wafer, inserting a first dicing blade into the semiconductor wafer from the main surface side to the back surface side of the semiconductor wafer and causing the first dicing blade to run along the dicing region, thereby forming a dicing groove in the main surface of the semiconductor wafer (or dicing the main surface); (c) after the step (b), inserting a second dicing blade into the dicing groove from the main surface side of the semiconductor wafer and causing the second dicing blade to run along the dicing region, thereby separating the semiconductor wafer into a plurality of semiconductor chips; (d) placing (fixing, mounting) the semiconductor chips (or one of them) obtained in the step (c) over a chip mounting portion (for example, die pad) of a chip mounting substrate (for example, a lead frame or a wiring substrate) (with, for example, an adhesive); (e) after the step (d), electrically coupling the semiconductor chip(s) (a plurality of electrode pads thereof) to the chip mounting substrate (a plurality of joining members (for example, leads) placed at the periphery of the chip mounting substrate) (through a plurality of conductive members (for example, bonding wires)); and (f) sealing the semiconductor chip(s) (and the conductive members) with a resin, wherein the semiconductor wafer has a base material layer (silicon substrate layer), a semiconductor element layer formed over the base material layer, a first interconnect layer (low-k layer) (made of, for example, copper and) formed over the semiconductor element layer, and a second interconnect layer (non-low-k layer) (made of, for example, copper and) formed over the first interconnect layer, wherein the dielectric constant of a first insulating layer placed (between a plurality of interconnects placed) in the first interconnect layer is lower than the dielectric constant of each of a premetal insulating layer formed in the semiconductor element layer and a second insulating layer placed (between a plurality of interconnects placed) in the second interconnect layer (the above-described condition can be replaced with any one of the following conditions: [1] the volume of an air gap formed in the first insulating layer is greater than the volume of an air gap formed in each of the premetal insulating layer and the second insulating layer, [2] the first insulating layer is more fragile than each of the premetal insulating layer and the second insulating layer, [3] the heat dissipation ratio of the first insulating layer is lower than that of each of the premetal insulating layer and the second insulating layer), wherein the planar shape of the first dicing blade (intersecting with the thickness direction of the first dicing blade) is circular, wherein the cross-sectional shape of the first dicing blade at the circumferential portion thereof has a first side face, a second side face having a first side-face angle of inclination relative to the first side face, and a third side face having relative to the first side face a second side-face angle of inclination greater than the first side-face angle of inclination, wherein the width between second boundary points of the second side face and the third side face is smaller than that between first boundary points of the first side face and the second side face, and wherein in the step (b), the first dicing blade is inserted into the semiconductor wafer so that the second boundary points of the first dicing blade reach the base material layer.

It is to be noted that since the first dicing blade has a small width at the tip portion thereof (compared with the width of a blade such as straight blade having a large width), a stress on the low-k layer when the blade is inserted into the low-k layer can be reduced and as a result, the low-k layer can be prevented from damages or cracks.

In addition, since the low-k layer is cut with the inclined second side face of the first dicing blade, a stress on the low-k layer when the blade is inserted thereinto (or brought into contact therewith) can be reduced (compared with the case where a blade such as straight blade whose side face to be brought into contact with the low-k layer is perpendicular thereto) and as a result, the low-k layer can be prevented from damages or cracks.

2. The manufacturing method of a semiconductor device as described above in 1, wherein the planar shape of the second dicing blade to be used in the step (c) which intersects with a thickness direction of the second dicing blade is circular, wherein the cross-sectional shape of the second dicing blade at the circumference thereof has a fourth side face and a tip face, wherein the width between third boundary points of the fourth side face and the tip face is smaller than the width between portions of the second side faces of the first dicing blade to be brought into contact with the semiconductor element layer, and wherein in the step (c), the second dicing blade is inserted into the dicing groove so that a portion of the second dicing blade reaches a dicing tape (a member for supporting the separated semiconductor chips) attached to the back surface of the semiconductor wafer before the step (b).

3. The manufacturing method of a semiconductor device as described above in 1 or 2, wherein the device regions each has a rectangular planar shape, wherein a plurality of electrode pads are formed in each of the device regions along the sides thereof, and wherein in each of the device regions, a seal ring is formed between the electrode pads and the side (or between electrode pads for product and test pads) and along the sides.

4. The manufacturing method of a semiconductor device as described above in any one of 1 to 3, wherein an insulating film (organic film) is formed in the dicing region to cover the test pads, and wherein after the step (a) but before the step (b), a metal layer is formed over the electrode pads formed in each of the device regions.

5. The manufacturing method of a semiconductor device as described above in 4, wherein the metal layer is formed by electroless plating.

6. The manufacturing method of a semiconductor device as described above in any one of 1 to 5, wherein the test pads formed in the dicing region of the main surface of the semiconductor wafer are electrically coupled to the semiconductor element layer via the first interconnect layer and the second interconnect layer.

7. The manufacturing method of a semiconductor device as described above in 6, wherein in the step (b), all the test pads are removed with the first dicing blade.

8. The manufacturing method of a semiconductor device as described above in 6, wherein in the step (b), some of the test pads are removed with the first dicing blade.

9. A manufacturing method of a semiconductor device comprising the steps of: (a) preparing a semiconductor wafer having a main surface, a plurality of device regions formed over the main surface, a dicing region formed between the device regions, and a back surface on a side opposite to the main surface; (b) in the dicing region of the semiconductor wafer, inserting a first dicing blade into the semiconductor wafer from the main surface side to the back surface side of the semiconductor wafer and causing the first dicing blade to run along the dicing region, thereby forming a dicing groove in the main surface of the semiconductor wafer (or cutting the main surface); (c) after the step (b), inserting a second dicing blade into the dicing groove from the main surface side of the semiconductor wafer and causing the second dicing blade to run along the dicing region, thereby separating the semiconductor wafer into a plurality of semiconductor chips; (d) placing (fixing, mounting) the semiconductor chips (one of them) obtained in the step (c) over a chip mounting portion (for example, a die pad) of a chip mounting substrate (for example, a lead frame or a wiring substrate) (with, for example, an adhesive); (e) after the step (d), electrically coupling the semiconductor chip(s) (a plurality of electrode pads thereof) to the chip mounting substrate (a plurality of joining members (for example, leads) placed at the periphery of the chip mounting substrate) (through a plurality of conductive members (for example, bonding wires)); and (f) sealing the semiconductor chip(s) with a resin, wherein the semiconductor wafer has a base material layer (silicon substrate layer), a semiconductor element layer formed over the base material layer, a first interconnect layer (low-k layer) (made of, for example, copper and) formed over the semiconductor element layer, and a second interconnect layer (non-low-k layer) (made of, for example, copper and) formed over the first interconnect layer, wherein the dielectric constant of a first insulating layer placed (between a plurality of interconnects placed) in the first interconnect layer is lower than the dielectric constant of each of a premetal insulating layer formed in the semiconductor element layer and a second insulating layer placed (between a plurality of interconnects placed) in the second interconnect layer (the above-described condition can be replaced with any one of the following conditions: [1] the volume of an air gap formed in the first insulating layer is greater than the volume of an air gap formed in each of the premetal insulating layer and the second insulating layer, [2] the first insulating layer is more fragile than each of the premetal insulating layer and the second insulating layer, [3] the heat dissipation ratio of the first insulating layer is lower than that of each of the premetal insulating layer and the second insulating layer), wherein the planar shape of the first dicing blade (intersecting with the thickness direction of the first dicing blade) is circular, wherein the cross-sectional shape of the first dicing blade at the circumferential portion thereof has a first face and a second face having a first side-face angle of inclination relative to the first face, and wherein in the step (b), the first dicing blade is caused to run along the dicing region so that the first interconnect layer (all the cutting faces of the first interconnect layer) is brought into contact with the second face of the first dicing blade.

10. The manufacturing method of a semiconductor device as described above in 9, wherein the planar shape of the second dicing blade to be used in the step (c) which intersects with a thickness direction of the second dicing blade is circular, wherein the cross-sectional shape of the second dicing blade at the circumferential portion thereof has a fourth face and a tip face, wherein the width between third boundary points of the fourth face and the tip face is smaller than the width between portions of the second faces of the first dicing blade to be brought into contact with the semiconductor element layer, and wherein in the step (c), the second dicing blade is inserted into the dicing groove so that a portion of the second dicing blade reaches a dicing tape attached to the back surface side of the semiconductor wafer before the step (b).

11. The manufacturing method of a semiconductor device as described above in 9 or 10, wherein the device regions have each a rectangular planar shape, wherein a plurality of electrode pads are formed in each of the device regions along sides thereof, and wherein in each of the device regions, a seal ring is formed between the electrode pads and the sides (or between electrode pads for products and test pads) and along the sides.

12. The manufacturing method of a semiconductor device as described above in any one of 9 to 11, wherein an insulating film (organic film) is formed in the dicing region to cover the test pads, and wherein after the step (a) and prior to the step (b), a metal layer is formed over the electrode pads formed in each of the device regions.

13. The manufacturing method of a semiconductor device as described above in 12, wherein the metal layer is formed by electroless plating.

14. The manufacturing method of a semiconductor device as described above in any one of 9 to 13, wherein the test pads formed in the dicing region of the main surface of the semiconductor wafer are electrically coupled to the semiconductor element layer via the first interconnect layer and the second interconnect layer.

15. The manufacturing method of a semiconductor device as described above in 14, wherein in the step (b), all the test pads are removed by the first dicing blade.

16. The manufacturing method of a semiconductor device as described above in 14, wherein in the step (b), some of the test pads are removed by the first dicing blade.

17. A semiconductor device comprising (a) a chip mounting portion, (b) a plurality of joining members (placed at the periphery of the chip mounting portion), (c) a semiconductor chip having a main surface, a plurality of electrode pads formed over the main surface, a back surface on a side opposite to the main surface, and a side face between the main surface and the back surface, and placed over the chip mounting portion, (d) a plurality of conductive members for electrically coupling the electrode pads of the semiconductor chip to the joining members, respectively, and (e) a sealing member for sealing the semiconductor chip (and the conductive members) (so as to expose a portion of each of the joining members (and a portion of the chip mounting portion)), wherein the semiconductor chip has a base material layer (silicon substrate layer), a semiconductor element layer formed over the base material layer, a first interconnect layer (low-k layer) (made of, for example, copper and) formed over the semiconductor element layer, and a second interconnect layer (non-low-k layer) (made of, for example, copper and) formed over the first interconnect layer, wherein the dielectric constant of a first insulating layer placed (between a plurality of interconnects placed) in the first interconnect layer is lower than the dielectric constant of each of a premetal insulating layer formed in the semiconductor element layer and a second insulating layer placed (between a plurality of interconnects placed) in the second interconnect layer (the above-described condition can be replaced with any one of the following conditions: [1] the volume of air gaps formed in the first insulating layer is greater than the volume of air gaps formed in each of the premetal insulating layer and the second insulating layer, [2] the first insulating layer is more fragile than each of the premetal insulating layer and the second insulating layer, and [3] the heat dissipation ratio of the first insulating layer is lower than that of each of the premetal insulating layer and the second insulating layer), and wherein the side face of the semiconductor chip has a first end face from which a portion of the first interconnect layer is exposed, a second end face located nearer to the back surface side of the semiconductor chip than the first end face, and a third end face for connecting the first end face with the second end face.

18. The semiconductor device as described above in 17, wherein the second end face is formed in a perpendicular direction to the back surface, wherein the third end face forms a first end-face angle of inclination relative to the second end face, and wherein the first end face forms, relative to the second end face, a second end-face angle of inclination smaller than the first end-face angle of inclination.

19. The semiconductor device as described above in 18, wherein the first end-face angle of inclination is 90°.

20. The semiconductor device as described above in any one of 17 to 19, wherein the electrode pads are electrically coupled to the semiconductor element layer, respectively, via the first interconnect layer and the second interconnect layer.

21. A manufacturing method of a semiconductor device comprising the steps of: (a) preparing a semiconductor wafer having a main surface, a plurality device regions formed over the main surface, a dicing region formed between the device regions, and a back surface on a side opposite to the main surface; (b) in the dicing region of the semiconductor wafer, inserting a first dicing blade into the semiconductor wafer from the main surface side to the back side of the semiconductor wafer and causing the first dicing blade to run along the dicing region, thereby forming a dicing groove in the main surface of the semiconductor wafer; (c) after the step (b), inserting a second dicing blade into the dicing groove from the main surface side of the semiconductor wafer and causing the second dicing blade to run along the dicing region, thereby separating the semiconductor wafer into a plurality of semiconductor chips; (d) placing the semiconductor chips obtained in the step (c) over a chip mounting portion of a chip mounting substrate; (e) after the step (d), electrically coupling the semiconductor chip and the chip mounting substrate respectively; and (f) sealing the semiconductor chip with a resin, wherein the semiconductor wafer has a base material layer, a semiconductor element layer formed over the base material layer, a first interconnect layer formed over the semiconductor element layer, and a second interconnect layer formed over the first interconnect layer, wherein the dielectric constant of a first insulating layer placed in the first interconnect layer is lower than the dielectric constant of a second insulating layer placed in the second interconnect layer, wherein the first dicing blade has a planer circular shape, wherein the cross-sectional shape of the first dicing blade at the periphery thereof has a first side face, a second side face having a first side-face angle of inclination relative to the first side face, and a third side face having relative to the first side face a second side-face angle of inclination greater than the first side-face angle of inclination, wherein the width between second boundary points of the second side face and the third side face is smaller than the width between first boundary points of the first side face and the second side face, and wherein in the step (b), the points of the first boundary of the first dicing blade exist outside of the main surface of the semiconductor wafer and the first dicing blade is inserted into the semiconductor wafer so that the points of the second boundary reach the base material layer, exceeding the semiconductor element layer.

22. The manufacturing method of a semiconductor device as described above in 21, wherein the planar shape of the second dicing blade to be used in the step (c) which intersects with a thickness direction of the second dicing blade is circular, wherein the cross-sectional shape of the second dicing blade at the circumferential portion thereof has a fourth side face and a tip face, wherein the width between third boundary points of the fourth side face and the tip face is smaller than the width between portions of the second side faces of the first dicing blade to be brought into contact with the semiconductor element layer, and wherein in the step (c), the second dicing blade is inserted into the dicing groove so that a portion of the second dicing blade reaches a dicing tape attached to the back surface of the semiconductor wafer before the step (b).

23. The manufacturing method of a semiconductor device as described above in 21 or 22, wherein the device regions each has a rectangular planar shape, wherein a plurality of electrode pads are formed in each of the device regions along sides thereof, and wherein in each of the device regions, a seal ring is formed between the electrode pads and the sides and along the sides.

24. The manufacturing method of a semiconductor device as described above in any one of 21 to 23, wherein an insulating film is formed in the dicing region to cover test pads, and wherein after the step (a) and prior to the step (b), a metal layer is formed over the electrode pads formed in each of the device regions.

25. The manufacturing method of a semiconductor device as described above in 24, wherein the metal layer is formed by electroless plating.

26. The manufacturing method of a semiconductor device as described above in any one of 21 to 25, wherein the test pads formed in the dicing region of the main surface of the semiconductor wafer are electrically coupled to the semiconductor layer via the first interconnect layer and the second interconnect layer.

27. The manufacturing method of a semiconductor device as described above in 26, wherein in the step (b), all the test pads are removed with the first dicing blade.

28. The manufacturing method of a semiconductor device as described above in 26, wherein in the step (b), some of the test pads are removed with the first dicing blade.

29. The manufacturing method of a semiconductor device as described above in any one of 21 to 28, wherein the second side-face angle of inclination is approximately 90°.

30. The manufacturing method of a semiconductor device as described above in any one of 21 to 29, wherein the dicing groove has an upper first chip end-face and a lower third chip end-face, and wherein in the step (c), the second dicing blade is inserted into the dicing groove and run therein so that the side face of the second dicing blade does not come into contact with the first chip end-face.

31. A manufacturing method of a semiconductor device comprising the steps of: (a) preparing a semiconductor wafer having a main surface, a plurality device regions formed over the main surface, a dicing region formed between the device regions, and a back surface on a side opposite to the main surface; (b) in the dicing region of the semiconductor wafer, inserting a first dicing blade into the semiconductor wafer from the main surface side to the back surface side of the semiconductor wafer and causing the first dicing blade to run along the dicing region, thereby forming a dicing groove in the main surface of the semiconductor wafer; (c) after the step (b), inserting a second dicing blade into the dicing groove from the main surface side of the semiconductor wafer and causing the second dicing blade to run along the dicing region, thereby separating the semiconductor wafer into a plurality of semiconductor chips; (d) placing the semiconductor chips obtained in the step (c) over a chip mounting portion of a chip mounting substrate; (e) after the step (d), electrically coupling the semiconductor chips to the chip mounting substrate, respectively; and (f) sealing the semiconductor chips with a resin, wherein the semiconductor wafer has a base material layer, a semiconductor element layer formed over the base material layer, a first interconnect layer formed over the semiconductor element layer, and a second interconnect layer formed over the first interconnect layer, wherein the dielectric constant of a first insulating layer placed in the first interconnect layer is lower than the dielectric constant of a second insulating layer placed in the second interconnect layer, wherein the first dicing blade has a circular planar shape, wherein the cross-sectional shape of the first dicing blade at the circumferential portion thereof has a first face and a second face having a first side-face angle of inclination relative to the first face, and wherein in the step (b), the first boundary points of the first dicing blade exist outside of the main surface of the semiconductor wafer and the first dicing blade is caused to run along the dicing region so that the second boundary points cross the semiconductor element layer to reach the base material layer and the first interconnect layer comes into contact with the second face of the first dicing blade.

32. The manufacturing method of a semiconductor device as described above in 31, wherein the planar shape of the second dicing blade to be used in the step (c) which intersects with a thickness direction of the second dicing blade is circular, wherein the cross-sectional shape of the second dicing blade at the circumferential portion thereof has a fourth side face and a tip face, wherein the width between third boundary points of the fourth side face and the tip face is smaller than the width between portions of the second faces of the first dicing blade to be brought into contact with the semiconductor element layer, and wherein in the step (c), the second dicing blade is inserted into the dicing groove so that a portion of the second dicing blade reaches a dicing tape attached to the back surface of the semiconductor wafer before the step (b).

33. The manufacturing method of a semiconductor device as described above in 31 or 32, wherein each of the device regions has a rectangular planar shape, wherein in each of the device regions, a plurality of electrode pads are formed in each of the device regions along the sides thereof; and a seal ring is formed between the electrode pads and the sides.

34. The manufacturing method of a semiconductor device as described above in any one of 31 to 33, wherein an insulating film is formed in the dicing region to cover test pads, and wherein after the step (a) but before the step (b), a metal layer is formed over the electrode pads formed in each of the device regions.

35. The manufacturing method of a semiconductor device as described above in 34, wherein the metal layer is formed by electroless plating.

36. The manufacturing method of a semiconductor device as described above in any one of 31 to 35, wherein the test pads formed in the dicing region of the main surface of the semiconductor wafer are electrically coupled to the semiconductor element layer via the first interconnect layer and the second interconnect layer.

37. The manufacturing method of a semiconductor device as described above in 36, wherein in the step (b), all the test pads are removed with the first dicing blade.

38. The manufacturing method of a semiconductor device as described above in 36, wherein in the step (b), some of the test pads are removed with the first dicing blade.

39. The manufacturing method of a semiconductor device as described above in any one of 31 to 38, wherein the second side-face angle of inclination is approximately 90°.

40. The manufacturing method of a semiconductor device as described above in any one of 31 to 39, wherein the dicing groove has an upper first chip end-face and a lower third chip end-face, and wherein in the step (c), the second dicing blade is inserted into the dicing groove and run therein so that the side face of the second dicing blade does not come into contact with the first chip end-face.

41. A semiconductor device comprising (a) a chip mounting portion, (b) a plurality of joining members, (c) a semiconductor chip having a main surface, a plurality of electrode pads formed over the main surface, a back surface on a side opposite to the main surface, and a side face between the main surface and the back surface, and placed over the chip mounting portion, (d) a plurality of conductive members for electrically coupling the electrode pads of the semiconductor chip to the joining members, respectively, and (e) a sealing member for sealing the semiconductor chip, wherein the semiconductor chip has (c1) a base material layer, (c2) a semiconductor element layer formed over the base material layer, (c3) a first interconnect layer formed over the semiconductor element layer, and (c4) a second interconnect formed over the first interconnect layer, wherein the dielectric constant of a first insulating layer placed in the first interconnect layer is lower than the dielectric constant of a second insulating layer placed in the second interconnect layer, and wherein the side face of the semiconductor chip has (i) a first end face from which a portion of the first interconnect layer is exposed, (ii) a second end face located nearer to the back surface side of the semiconductor chip than the first end face, and (iii) a third end face for connecting the first end face with the second end face, in which the second end face is substantially perpendicular to the back surface, the third end face forms a first end-face angle of inclination relative to the second end face, and the first end face forms, relative to the second end face, a second end-face angle of inclination smaller than the first end-face angle of inclination.

42. The semiconductor device as described above in 41, wherein the first end-face angle of inclination is 90°.

43. The semiconductor device as described above in 41 or 42, wherein the electrode pads are electrically coupled to the semiconductor element layer, respectively, via the first interconnect layer and the second interconnect layer.

44. The semiconductor device as described above in any one of 41 to 43, wherein the second end-face angle of inclination is 2° or greater but not greater than 20°.

45. The semiconductor device as described above in any one of 41 to 43, wherein the second end-face angle of inclination is 3° or greater but not greater than 15°.

46. The semiconductor device as described above in any one of 41 to 43, wherein the second end-face angle of inclination is 4° or greater but not greater than 10°.

47. The semiconductor device as described above in any one of 41 to 46, wherein the first insulating layer has a dielectric constant of 3 or less.

48. The semiconductor device as described above in any one of 41 to 47, wherein the second insulating layer has a dielectric constant exceeding 3.

49. The semiconductor device as described above in any one of 41 to 48, wherein the first end-face angle of inclination exceeds 20°.

50. The semiconductor device as described above in any one of 41 to 49, wherein the first insulating layer has a dielectric constant of 3 or less and the second insulating layer has a dielectric constant exceeding 3.

51. The manufacturing method of a semiconductor device as described above in any one of 1 to 40, wherein the second side-face angle of inclination is 2° or greater but not greater than 20°.

52. The manufacturing method of a semiconductor device as described above in any one of 1 to 40, wherein the second side-face angle of inclination is 3° or greater but not greater than 15°.

53. The manufacturing method of a semiconductor device as described above in any one of 1 to 40, wherein the second side-face angle of inclination is 4° or greater but not greater than 10°.

54. The manufacturing method of a semiconductor device as described above in any one of 1 to 40, wherein the first insulating layer has a dielectric constant of 3 or less.

55. The manufacturing method of a semiconductor device as described above in any one of 1 to 40, wherein the second insulating layer has a dielectric constant exceeding 3.

56. The manufacturing method of a semiconductor device as described above in any one of 1 to 40, wherein the first side-face angle of inclination exceeds 20°.

57. The manufacturing method of a semiconductor device as described above in any one of 1 to 40, wherein the first insulating layer has a dielectric constant of 3 or less and the second insulating layer has a dielectric constant exceeding 3.

58. The manufacturing method of a semiconductor device as described above in any one of 1 to 40, wherein the insulating film is an organic insulating film.

59. The manufacturing method of a semiconductor device as described above in any one of 1 to 40, wherein the insulating film has a polyimide resin film as a main component thereof.

60. The manufacturing method of a semiconductor device as described above in any one of 1 to 40, wherein the cross-section, in the thickness direction, of a portion of the first dicing blade on the more tip side than the second boundary points extends perpendicular to the radial direction of the first blade and has a flat tip face.

61. The manufacturing method of a semiconductor device as described above in any one of 1 to 40, wherein the cross-section, in the thickness direction, of a portion of the first dicing blade on the more tip side than the second boundary points is curved.

62. The manufacturing method of a semiconductor device as described above in any one of 1 to 40, wherein the cross-section, in the thickness direction, of a portion of the first dicing blade on the more tip side than the second boundary points is an isosceles triangle.

63. The manufacturing method of a semiconductor device as described above in any one of 1 to 40, wherein the cross-section, in the thickness direction, of the first dicing blade on the more tip side than the second boundary points is an isosceles triangle with beveled apexes.

64. A manufacturing method of a semiconductor device comprising the steps of: (a) preparing a semiconductor wafer having a main surface, a plurality device regions formed over the main surface, a dicing region formed between the device regions, and a back surface on a side opposite to the main surface; (b) in the dicing region of the semiconductor wafer, inserting a first dicing blade into the semiconductor wafer from the main surface side to the back surface side of the semiconductor wafer and causing the first dicing blade to run along the dicing region, thereby forming a dicing groove in the main surface of the semiconductor wafer; (c) after the step (b), inserting a second dicing blade into the dicing groove from the main surface side of the semiconductor wafer and causing the second dicing blade to run along the dicing region, thereby separating the semiconductor wafer into a plurality of semiconductor chips; (d) placing the semiconductor chips obtained in the step (c) over a chip mounting portion of a chip mounting substrate; (e) after the step (d), electrically coupling the semiconductor chip to the chip mounting substrate; and (f) sealing the semiconductor chip with a resin, wherein the semiconductor wafer has (i) a base material layer, (ii) a semiconductor element layer formed over the base material layer, and (iii) a multilevel interconnect layer formed over the semiconductor element layer, wherein the first dicing blade has a circular planar shape, wherein the cross-sectional shape of the first dicing blade at the circumferential portion thereof has a first side face, a second side face having a first side-face angle of inclination relative to the first side face, and a third side face having, relative to the first side face, a second side-face angle of inclination greater than the first side-face angle of inclination, wherein the width between second boundary points of the second side face and the third side face is smaller than the width between the first boundary points of the first side face and the second side face, and wherein in the step (b), the first boundary points of the first dicing blade exist outside of the main surface of the semiconductor wafer and the first dicing blade is inserted into the semiconductor wafer so that the second boundary points cross the semiconductor element layer and reach the base material layer.

65. The manufacturing method of a semiconductor device as described above in 64, wherein the planar shape of the second dicing blade to be used in the step (c) which intersects with the thickness direction of the second dicing blade is circular, wherein the cross-sectional shape of the second dicing blade at the circumferential portion thereof has a fourth side face and a tip face; the width between third boundary points of the fourth side face and the tip face is smaller than the width between portions of the second side faces of the first dicing blade to be brought into contact with the semiconductor element layer, and wherein in the step (c), the second dicing blade is inserted into the dicing groove so that a portion of the second dicing blade reaches a dicing tape attached to the back surface of the semiconductor wafer before the step (b).

66. The manufacturing method of a semiconductor device as described above in 64 or 65, wherein the device regions each has a rectangular planar shape, wherein a plurality of electrode pads are formed in each of the device regions along the sides thereof, and wherein in each of the device regions, a seal ring is formed between the electrode pads and the sides and along the sides.

67. The manufacturing method of a semiconductor device as described above in 64 or 65, wherein an insulating film is formed in the dicing region so as to cover test pads therewith, and wherein after the step (a) but before the step (b), a metal layer is formed over the electrode pads formed in each of the device regions.

68. The manufacturing method of a semiconductor device as described above in 67, wherein the metal layer is formed by electroless plating.

69. The manufacturing method of a semiconductor device as described above in any one of 64 to 68, wherein the test pads formed in the dicing region of the main surface of the semiconductor wafer are electrically coupled to the semiconductor element layer via the first interconnect layer and the second interconnect layer.

70. The manufacturing method of a semiconductor device as described above in 69, wherein in the step (b), all the test pads are removed with the first dicing blade.

71. The manufacturing method of a semiconductor device as described above in 69, wherein in the step (b), some of the test pads are removed with the first dicing blade.

72. The manufacturing method of a semiconductor device as described above in any one of 64 to 71, the second side-face angle of inclination is approximately 90°.

73. The manufacturing method of a semiconductor device as described above in any one of 64 to 72, wherein the dicing groove has an upper first chip end-face and a lower third chip end-face, and wherein in the step (c), the second dicing blade is inserted into the dicing groove and caused to run therein so as not to bring the side face of the second dicing blade into contact with the first chip end-face.

74. The manufacturing method of a semiconductor device as described above in any one of 64 to 73, wherein the second side-face angle of inclination is 2° or greater but not greater than 20°.

75. The manufacturing method of a semiconductor device as described above in any one of 64 to 73, wherein the second side-face angle of inclination is 3° or greater but not greater than 15°.

76. The manufacturing method of a semiconductor device as described above in any one of 64 to 73, wherein the second side-face angle of inclination is 4° or greater but not greater than 10°.

77. The manufacturing method of a semiconductor device as described above in any one of 64 to 76, wherein the first side-face angle of inclination exceeds 20°.

78. The manufacturing method of a semiconductor device as described above in any one of 64 to 77, wherein the insulating film is an organic insulating film.

79. The manufacturing method of a semiconductor device as described above in any one of 64 to 77, wherein the insulating film has a polyimide resin film as a main component.

80. The manufacturing method of a semiconductor device as described above in any one of 64 to 79, wherein the cross-section, in the thickness direction, of a portion of the first dicing blade on the more tip side than the second boundary points extends perpendicular to the radial direction of the first blade and has a flat tip face.

81. The manufacturing method of a semiconductor device as described above in any one of 64 to 79, wherein the cross-section, in the thickness direction, of a portion of the first dicing blade on the more tip side than the second boundary points is curved.

82. The manufacturing method of a semiconductor device as described above in any one of 64 to 79, wherein the cross-section, in the thickness direction, of a portion of the first dicing blade on the more tip side than the second boundary points is an isosceles triangle.

83. The manufacturing method of a semiconductor device as described above in any one of 64 to 79, wherein the cross-section, in the thickness direction, of a portion of the first dicing blade on the more tip side than the second boundary points is an isosceles triangle with beveled apexes.

[Explanation of description manner, basic terms, and usage in the present application] 1. In the present invention, a description in the embodiments may be made after divided in plural sections if necessary for convenience's sake. These plural sections are not independent each other, but they may each be a part of a single example or one of them may be a partial detail of the other or a modification example of a part or whole of the other one unless otherwise specifically indicated. In principle, description on a portion similar to that described before is not repeated. Moreover, when a reference is made to constituent elements in the embodiments, they are not essential unless otherwise specifically indicated, limited to the number theoretically, or principally apparent from the context that it is not.

2. With regard to any material, any composition or the like in the description of the embodiments, the term "X made of A" or the like does not exclude X having, as one of the main constituting components thereof, an element other than A unless otherwise specifically indicated or principally apparent from the context it is not.

For example, the term "X made of A" means that "X has, as a main component thereof, A". It is needless to say that, for example, the term "silicon member" is not limited to a member made of pure silicon but also a member containing a SiGe alloy, another multi-element alloy having silicon as a main component, an additive, or the like.

Similarly, the term "copper interconnect", "aluminum interconnect", or the like is not limited to a pure copper interconnect, a pure aluminum interconnect, or the like but means a copper-based interconnect, an aluminum-based interconnect, or the like. This will also apply to the term "polyimide film", "gold plated layer", or the like.

Similarly, it is needless to say that the term "silicon oxide film" means not only a relatively pure undoped silicon dioxide film but also a thermal oxide film such as FSG (fluorosilicate glass) film, TEOS-based silicone oxide film, SiOC (silicon oxycarbide) film, carbon-doped silicon oxide film, OSG (organosilicate glass) film, PSG (phosphorus silicate glass) film, or BPSG (borophosphosilicate glass) film, a CVD oxide film, a coating type silicon oxide film such as SOG (spin on glass) film or NSC (nano-clustering silica) film, silica-based Low-k insulating film (porous insulating film) obtained by introducing pores into similar members thereto, and composite film between such a film as a main constituting element and another silicon-based insulating film.

3. Preferred examples of the shape, position, attribute, and the like will be shown, however, it is needless to say that the shape, position, attribute, and the like are not strictly limited to the preferred examples unless otherwise specifically indicated or apparent from the context that it is not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor device (which may be a semiconductor integrated circuit device or an electronic device) is to be formed. It is however needless to say that it embraces a composite wafer of a semiconductor layer and an insulating substrate such as epitaxial wafer, SOI substrate, LCD glass substrate, or the like.

6. The term "low-k insulating film" may usually mean an insulating film having a relatively low dielectric constant compared with, for example, a non-porous plasma TEOS silicon oxide film. In the invention, however, an insulating film having a dielectric constant of 3 or less is called "low-k insulating film" in accordance with the conventional practices in the semiconductor field, while an insulating film having a dielectric constant exceeding 3 is called "non-low-k insulating film". Reduction of a dielectric constant to 3 or less usually requires incorporation of an adequate amount of carbon in the material composition or requires introduction of micro-size pores or macro-size air gaps (voids) into the material structure, which however deteriorates the material strength or structure strength. Accordingly, in the invention, FSG (fluorosilicate glass) films belong to non-Low-k insulating films (k=about 3.4).

Typical examples of the "low-k insulating film" include silicon/glass type CVD insulating films such as SiOC (silicon oxycarbide), carbon-doped silicon oxide, and OSG (organosilicate glass); SSQ (silsesquioxane)-based silicon/glass type coating insulating films (or SOG) such as HSQ (hydrogen silsesquioxane), MSQ (methyl-silsesquioxane), and PSQ (phenyl-silsesquioxane), heat-resistant high-molecular resins (including copolymers with siloxane and the like) such as polyimide-based organic resins and BCB (benzocyclobutene), and porous insulating films obtained by introducing micro-size pores or macro-size air gaps into the above-exemplified materials or "non-low-k insulating film" materials. These materials are of course usable in the embodiment of the present invention.

It is needless to say that the term "Low-k interconnect layer" or the like rarely means that the whole portion of the insulating film in an interconnect portion is made of a low-k insulating film and it means that the main portion of the insulating film (interlayer insulating film, intralayer insulating film) is made of a low-k insulating film. It is to be noted that a main insulating film of an interconnect layer may be called "interlayer insulating film" simply without distinguishing between interlayer and intralayer insulating films.

A multilevel interconnect layer is comprised of either or both of a low-k interconnect layer and a non-low-k interconnect layer and the low-k interconnect layer and non-low-k interconnect layer each usually includes a plurality of interconnect layers (generally, from approximately two layers to ten layers).

7. The term "ring-shaped (circular ring-shaped)" does not only mean a geometrical circle or circular ring but may be used as a meaning including a rectangular loop or the like loop based on the actual situation. In addition, it is not always limited to a closed loop in strict sense.

Further, the term "hub-shaped dicing blade" means not a circular disk-shaped one but a circular ring-shaped one in strict sense. When a reference is made to the peripheral or circumferential portion of a dicing blade, only the term "circle" is used to ensure simplicity.

[Details of Embodiments] Embodiments will next be described more specifically. In all the drawings, the same or like members will be identified by the same or like symbols or reference numerals and overlapping descriptions will be omitted in principle.

1. Description on the Outline of Each Embodiment of the Invention (Mainly from FIG. 25 to FIG. 29)

In recent years, due to the shrinking semiconductor process, the interconnect design rule or the thickness of interconnect layers tend to be smaller. In order to meet such a tendency, low-k materials have been employed as a material of insulating layers in multilevel interconnect.

Figure 27:
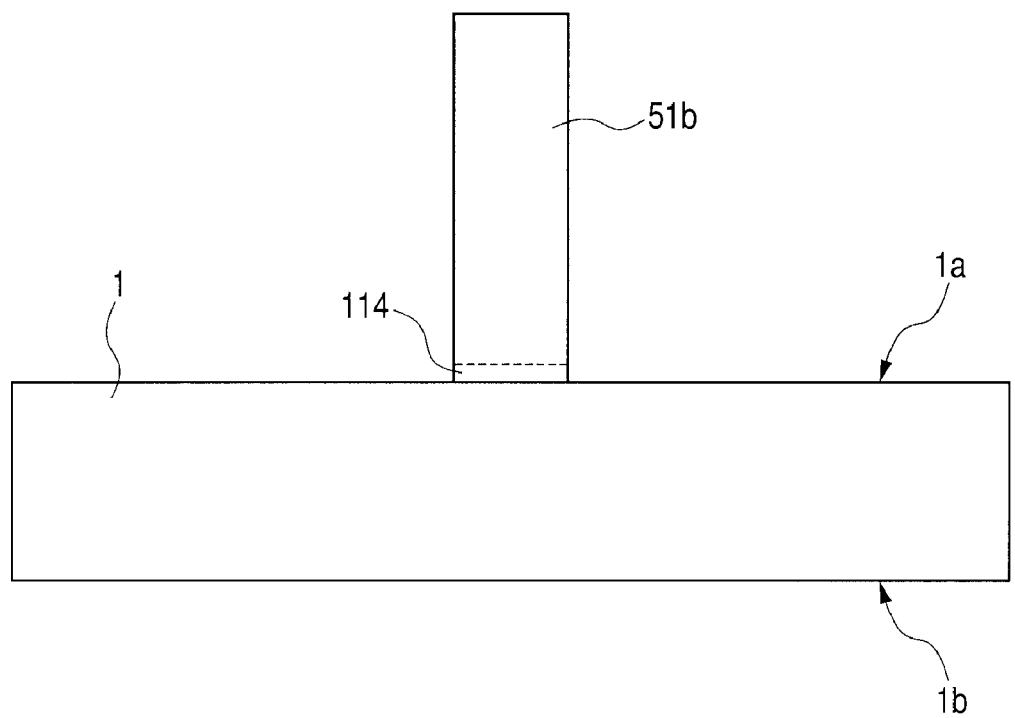
FIG. 27 is a referential cross-sectional view (straight blade 1) for describing the problem of the invention.
Figure 28:
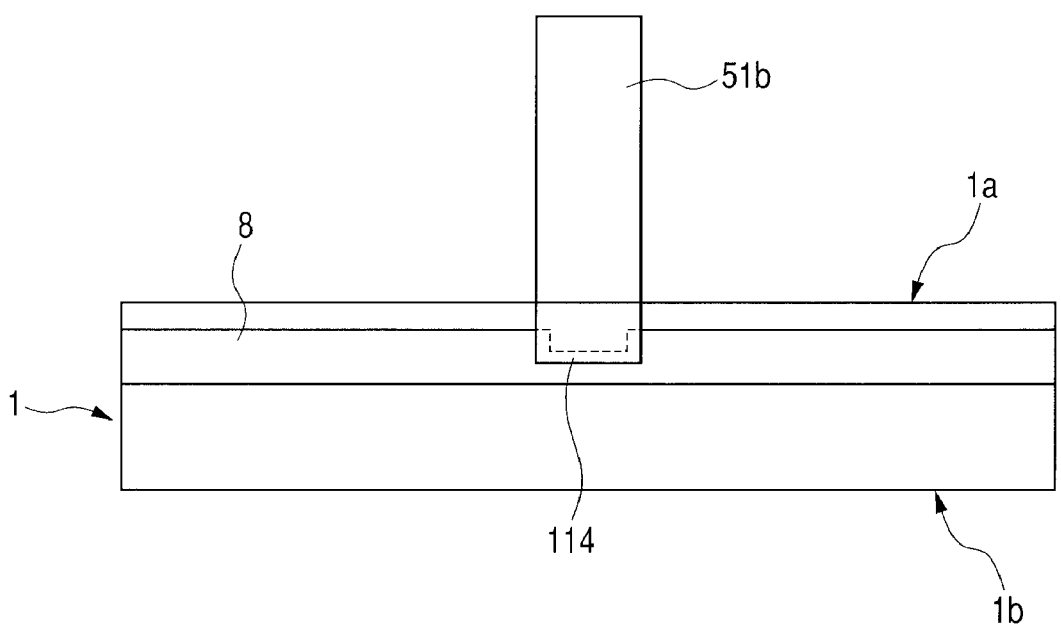
FIG. 28 is a referential cross-sectional view (straight blade 2) for describing the problem of the invention.

Low-k materials however have low strength. When they are cut with a straight blade, a contact area between the blade and the wafer becomes large as illustrated in FIGS. 27 and 28 and a cutting stress occurs at this contact surface. As a result, cracks are apt to appear in the low-strength low-k materials. It is apparent from FIGS. 27 and 28 that when a wafer 1 is cut from the side of a device surface 1a (surface opposite to a back surface 1b) with a straight blade 51b, a contact area 114 between the wafer and a tip portion of the blade is large. This may presumably cause a deterioration in the reliability of a semiconductor device.

Figure 29:
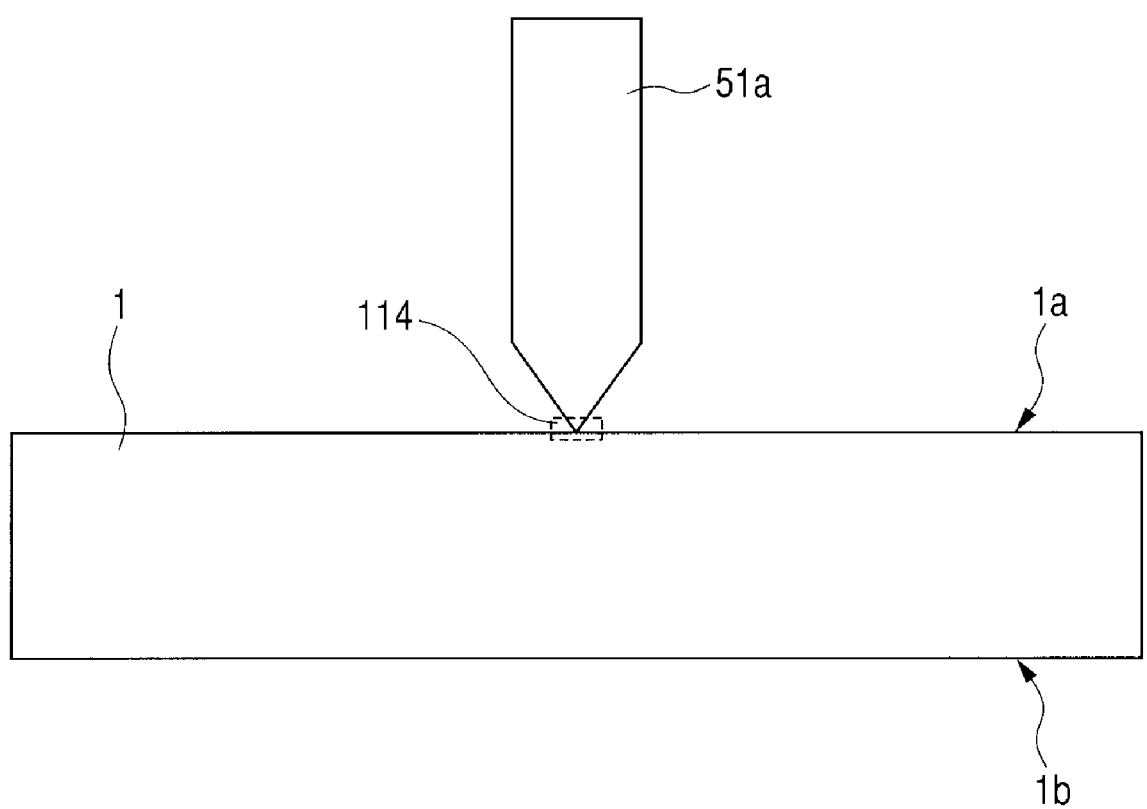
FIG. 29 is a referential cross-sectional view (tapered blade) for describing the problem of the invention.

The present inventors therefore have studied and found that this crack problem can be suppressed by adopting a step cutting operation, that is, first forming a dicing groove on the wafer surface with a tapered blade (first blade) and then fully cutting with a straight blade (second blade) having a smaller blade thickness than that of the tapered blade. As illustrated in FIG. 29, however, using a conventional wide-angle tapered blade (first blade) having a cross-sectional apex angle, in the radial direction, of from 60° to 90° (from 30° to 45° in terms of an angle of inclination made between the tapered face and the main surface of the wafer) enables to decrease the contact area 114 between the wafer and the tip portion of the blade, but an increase in the wear frequency of the tip portion (in addition to the short length of the tip portion) leads to such a problem that an exchange frequency increases.

In one embodiment of the invention, in a dicing step of a wafer, first a cutting groove reaching a semiconductor substrate is formed, from the device surface side of the wafer, with a narrow-angle tapered blade having a complementary angle of inclination of 70° or greater but not greater than 88° (a cross-sectional apex angle of from approximately 4° to 40°, meaning from approximately about 2° to 20° in terms of an angle of inclination) and then, the bottom of the groove is fully cut with a straight blade having a width smaller than the width of this cutting groove. This enables to prolong the blade life because the width of the tapered portion of the tapered blade can be made relatively large.

The narrow-angle tapered dicing blade has however a disadvantage that when the tip portion of the dicing blade is narrow, it wears quickly, which makes it difficult to control the height of the blade. This problem can be overcome by using a first cut blade having a two-step tapered shape (including a shape from which a tip portion has been removed) as will be described later in Section 2. Using such a blade is effective irrespective of a range of the angle of inclination. Using it in combination with a narrow-angle tapered blade is, however, more effective because the length of the tip portion can be increased. The outline of it will next be described.

Figure 25:
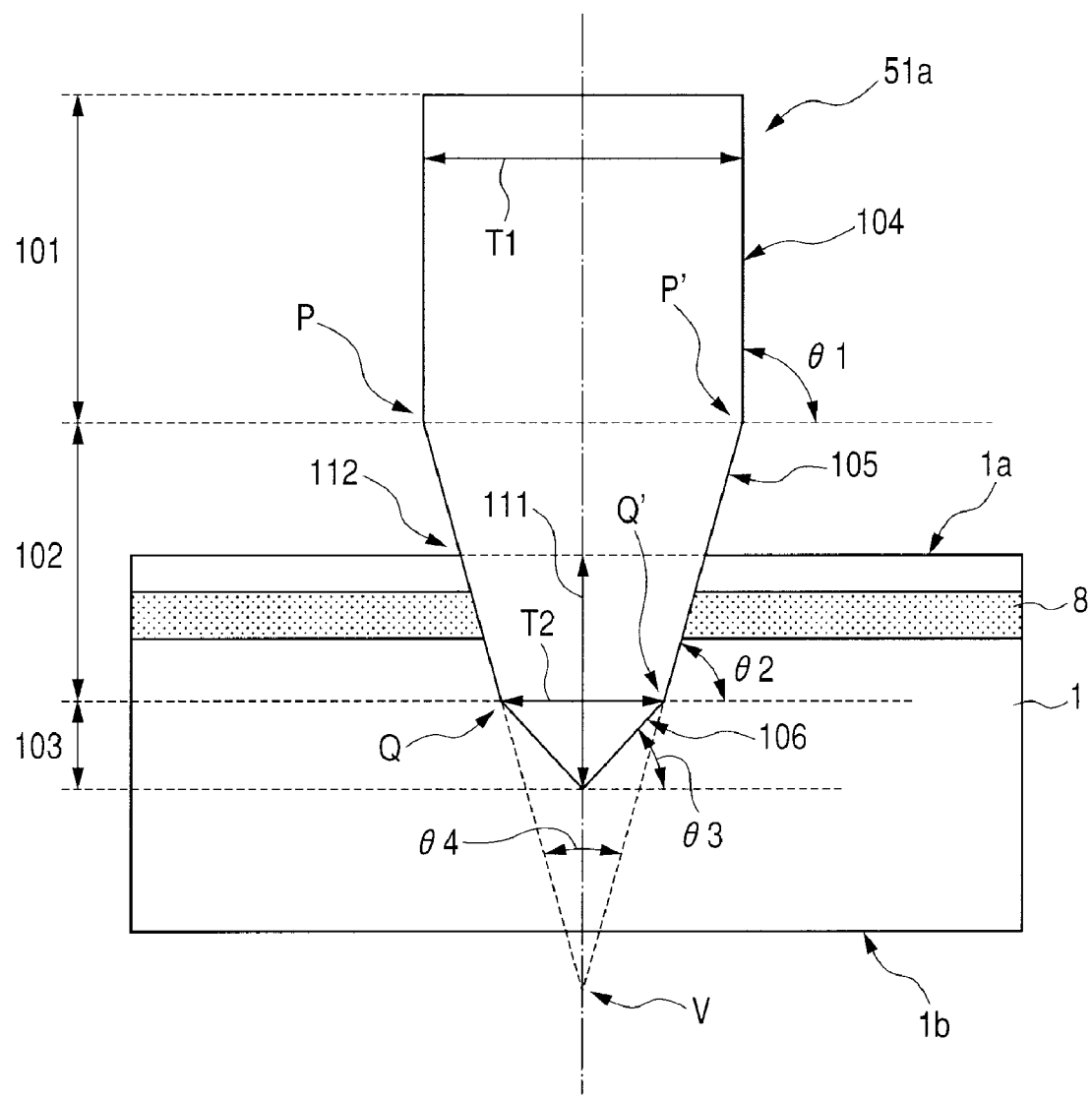
FIG. 25 is an explanatory view illustrating the relationship between the cross-sectional structure of a tapered dicing blade to be used in each dicing process of the invention and a member to be cut therewith.
Figure 26B:
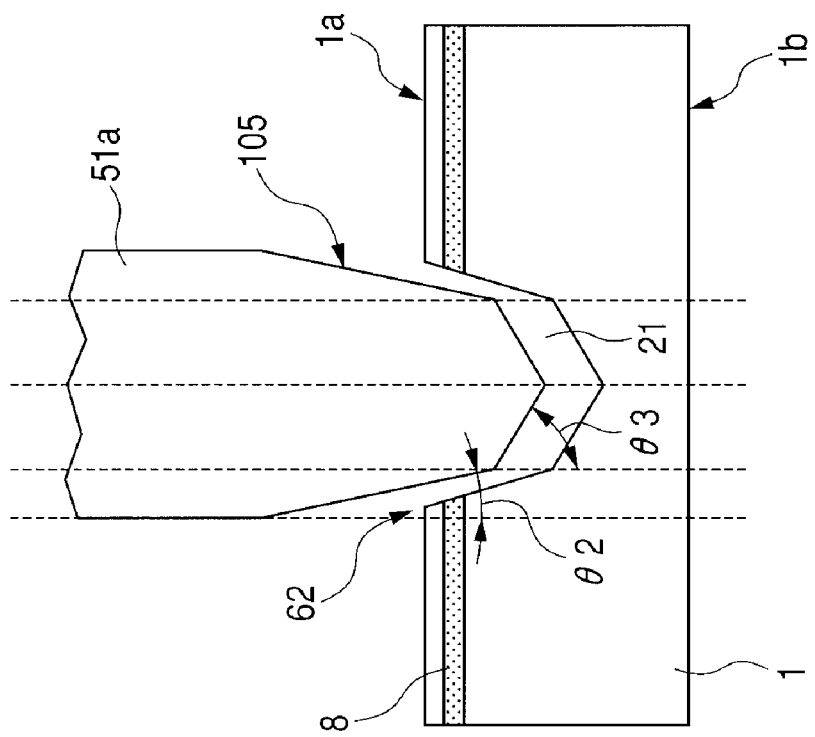
FIG. 26(b) is a cross-sectional view taken along a line C-C' of FIG. 26(a)
Figure 26A:
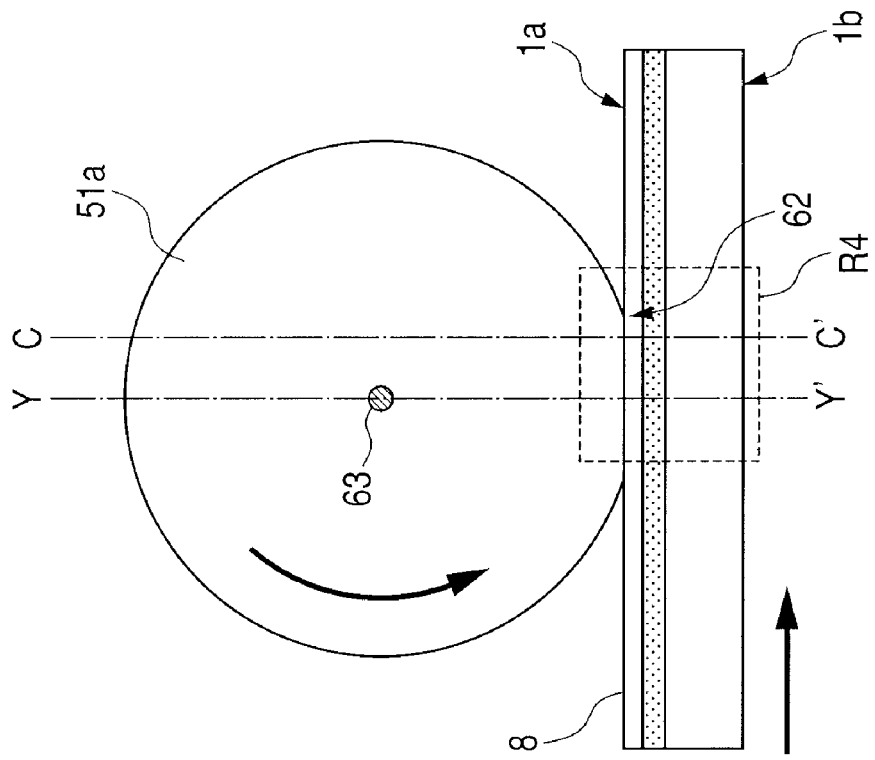

FIG. 25 (corresponding to a Y-Y' cross-section of a circumferential portion R4 of a dicing blade illustrated in FIG. 26($a$)) is a cross-sectional view (including a plate-like member such as semiconductor wafer to be diced), in a radial direction, of the circumferential portion of a tapered dicing blade 51$a$ to be used in a first cutting step of a two-step dicing process in the manufacturing method of a semiconductor device according to one embodiment of the invention. FIGS. 26($a$) and 26($b$) (26($a$) is an overall schematic cross-sectional view and 26($b$) is a C-C' cross-sectional view of the circumferential portion R4 of the dicing blade illustrated in FIG. 26($a$)) are process views for describing the principle of groove formation with the tapered dicing blade 51$a$ to be used in the first cutting step of the two-step dicing process in the manufacturing method of a semiconductor device according to the one embodiment of the invention. As illustrated in FIG. 25 or FIG. 26, the dicing blade is comprised of a flat inner ring portion 101 having a flat first side face 104 (a complementary angle of inclination θ1 of an inner-ring side face is, for example, 90°), an outer ring portion 102 lying below the inner ring portion and having an inclined second side face 105 (a complementary angle of inclination θ2 of the outer ring side face is, for example, 83°, which means that an angle of inclination Θ2 of the outer ring side face is 7°), and an outer edge portion 103 lying below the outer ring portion and having an inclined third side face 106 (a complementary angle of inclination θ3 of an outer edge side face is, for example, 45°, meaning that the angle of inclination Θ3 of the outer edge side face is °). In this drawing, a distance between first boundary points P and P' which are transition points from the flat first side face 104 to the inclined second side face 105 is designated as a first boundary point width T1, while a distance between second boundary points Q and Q' which are transition points from the second side face 105 to the third side face 106 is designated as a second boundary point width T2.

As is apparent from FIG. 25, a one-step tapered blade having a tip portion as QVQ' is narrow at the tip portion thereof so that the blade wears severely and the height of a blade edge is inevitable during cutting. The two-step tapered dicing blade 51$a$ illustrated in a solid line has, on the other hand, a relatively wide tip portion (the outer edge portion 103 and a portion of the outer ring portion 102 in the vicinity of the tip) so that wear of the dicing blade can be suppressed. As a result, frequent adjustment of a blade height becomes unnecessary or blade height can be adjusted easily. When a narrow-angle tapered blade is used, the life of it can be made considerably longer due to a relatively large width between P and Q, even if the outer edge portion 103 disappears as a result of wear, a portion of the outer ring portion 102 in the vicinity of the tip becomes a new outer edge portion 103.

Further, as illustrated in FIG. 25, only the outer ring side-face 105 (second side face) of a cutting portion 111 (a portion to be inserted into the inside of the wafer from the cutting face 112 of the wafer) of the tapered dicing blade 51$a$ (the first dicing blade) is brought into contact with a relatively fragile low-k interconnect layer 8 (the first interconnect layer). In addition, in the cross-section of FIGS. 26($a$) and 26($b$) near an escape point 62 of the blade at which chipping occurs most frequently, there is a space between the wall surface of the dicing groove 21 and the outer ring side-face 105 (second side face) of the tapered dicing blade 51$a$ because the blade is tapered. Such a structure enables to suppress generation of chipping greatly. This effect has no relationship with the presence or absence of the low-k interconnect layer 8 but it is eminent when the low-k interconnect layer 8 is present.

Figure 8:
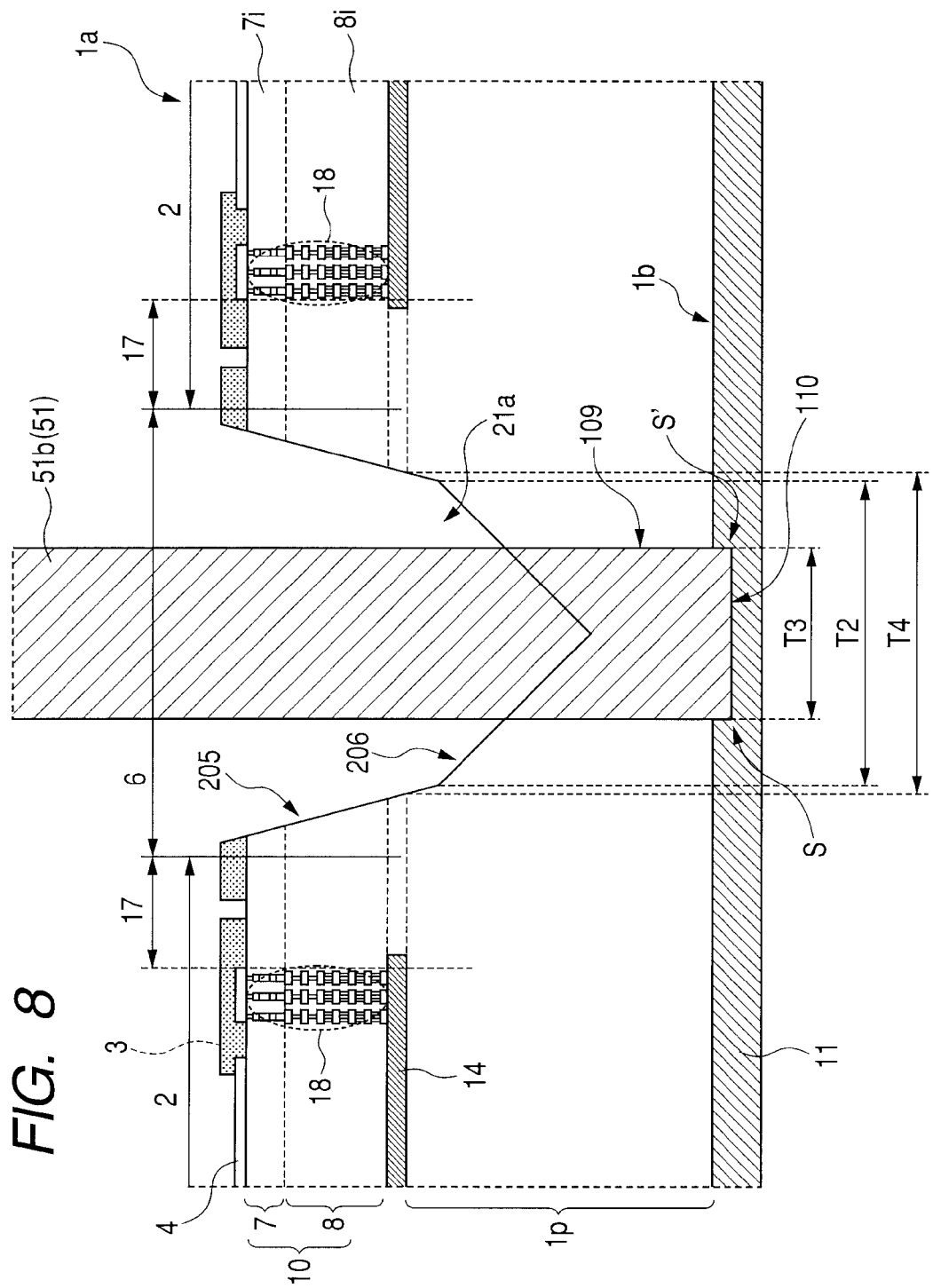
FIG. 8 is an enlarged cross-sectional view (before dicing with the second blade) of the periphery of the chips and the region between the chips illustrated in FIG. 7(c)

As will be described later based on FIG. 8 and the like, in the second step, the small-width straight blade 51$b$ (second dicing blade) having a blade thickness smaller than the second boundary point width T2 advances inside of a portion of the dicing groove 21 formed in the first step, which portion lies between a pair of second boundary points Q and Q', so that the side face of the straight blade 51$b$ does not come into contact with the exposed surface of the low-k interconnect layer 8 (the first interconnect layer). This also suppresses the occurrence of chipping greatly. The chipping (crack) hardly occurs unless the dicing blade comes into contact with the fragile low-k interconnect layer 8 so that it is only necessary that the width T3 of the second dicing blade 51$b$ is smaller than at least a width T4 (or the thickness of a blade of the corresponding portion) of a portion of the second side face (or second face) of the first dicing blade (tapered dicing blade) to be brought into contact with a semiconductor element layer 14. There is, however, a fear that since in the dicing step, the semiconductor wafer 1 is cut with a rotating dicing blade, the rotating operation and a contact stress with the semiconductor wafer 1 may cause a misalignment of a cutting position. In consideration of this misalignment, it is preferred that as described above, the width T3 of the second dicing blade 51$b$ is smaller than the width T2 between second boundary points.

2. Description on a Dicing Process in the Manufacturing Method of a Semiconductor Wafer According to the One Embodiment of the Invention (Mainly from FIG. 1($a$) to FIG. 10).

First, in this section, a preparation step for dicing will be described. As illustrated in FIGS. 1($a$) to 1($c$) (especially, FIG. 1($a$)), a semiconductor wafer 1 which has almost finished its wafer step must be prepared. The wafer 1 is, for example, a p type single crystal silicon substrate 1$p$ having a diameter of approximately 300ϕ (it may be 200ϕ or 450ϕ) and it has, on the device surface (main surface) 1$a$ thereof, many chip regions 2. Two of these chip regions R1 are illustrated in FIGS. 1($a$) to 1($c$) (particularly, FIG. 1($b$) and FIG. 1($c$) showing an X-X' cross-section thereof)). Most of the device surface 1$a$ (a surface opposite to the back surface 1$b$) except portions such as pad openings and scribe regions has been covered with a final passivation film 3 (for example, a lower inorganic insulating film and an upper photosensitive polyimide organic resin film). Electrode pads 4 (bonding pads) of a product region 2 and test electrode pads 5 of a dicing region 6 are formed corresponding to these openings. In the vicinity of the edge of the product region 2, a seal ring 18 is placed around. These electrode pads are usually formed as an aluminum (or may be copper) interconnect layer or pad layer. The wafer 1 has, over the substrate region thereof, a multilevel interconnect layer 10 having a lower low-k interconnect layer 8 (first interconnect layer) using, for example, an SiOC film (k=about 2.6) or the like as an interlayer insulating film 8$i$ (first insulating film) and an upper non-low-k insulating layer 7 (second interconnect layer) using, for example, a plasma TEOS silicon oxide film (k=about 4.1) as an interlayer insulating film 7i (second insulating film). Each interconnect layer is comprised of a copper type (which may be a silver type) damascene interconnect or a conventional aluminum type (which may include tungsten plug or the like) interconnect, or a combination of them. In the present embodiment, the electrode pads 4 having a rectangular planar shape (square planar shape in this embodiment) are placed along each side of the product region 2, but they may be placed in lines in the product region 2, may be arranged along one side of the product region 2 at the center of the product region 2, or may be gathered on one side of the product region 2.

Figure 2C:
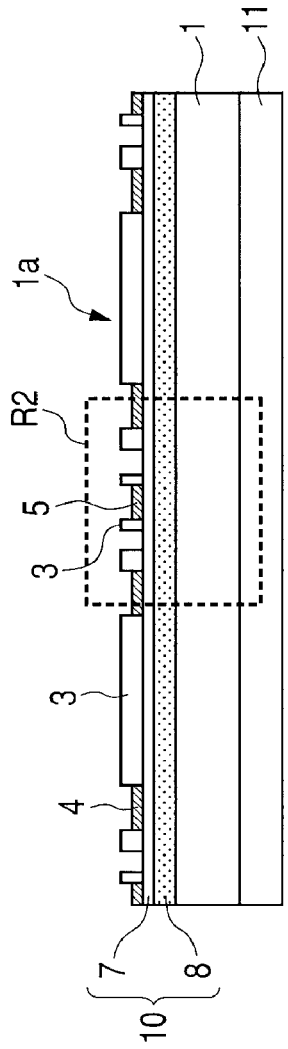
Figure 2A:
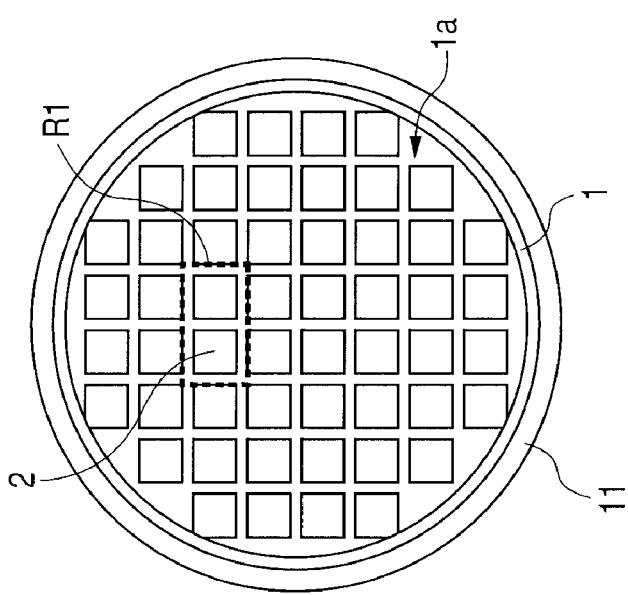

Next, as illustrated in FIG. 2, the back surface 1b of the wafer 1 is attached to a dicing tape 11 and then fixed to a dicing frame or the like. Details of a region R2 around chips and between chips will next be described specifically referring to FIG. 3. As illustrated in FIG. 3, the wafer 1 has, on the base material layer 1p thereof, a semiconductor element layer 14 (including well, silicon substrate surface, gate electrode, pre-metal layer, and the like). In a region L1 between seal rings, a dicing region 6 is set between a pair of chipping margin regions 17. The dicing region 6 has, inside thereof, a TEG test pad opening 15. Interconnects in the multilevel interconnect layers 10 constitute a seal ring 18 and a TEG test interconnect portion 19. In this embodiment, the back surface 1b of the wafer 1 is attached to the dicing tape 11 after preparation of the semiconductor wafer 1, but prior to attachment to the dicing tape 11, a redistribution layer may formed on the device surface (main surface) 1a of the semiconductor wafer 1 to change the position of the electrode pads 4.

Next, a cutting step with the tapered blade 51a, which is a first cutting step, will be described referring to FIGS. 4(a) to 4(c). As illustrated in FIGS. 4(a) to 4(c), the wafer is cut (half cut as a first step of two-step cutting) along a scribe line (a linear region in which scribe regions are connected) in each direction of X and Y to form a dicing groove 21a on the side of the device surface 1a of the wafer 1. Details of the cross-section will described based on FIG. 5. The cross-sectional structure of the tapered dicing blade 51a (first dicing blade) at the circumferential portion thereof is almost line-symmetric with respect to the center line in the thickness direction. It has a structure equipped with, from the rotation center side, a flat inner ring portion 101, an outer ring portion 102 having an inclined side face, an outer edge portion 103 having a further inclined face, and the like. A pair of these two inclination changed points (inflection points) are called first boundary points P and P' (between the flat inner ring portion 101 and the outer ring portion 102) and second boundary points Q and Q' (between the outer ring portion 102 and the outer edge portion 103), respectively. The distance between the first boundary points P and P' is called first boundary point width T1, while the distance between the second boundary points Q and Q is called second boundary point width T2. There is evidently the following relationship: T1>T2 between them. The cutting result with the tapered dicing blade 51a of FIG. 5 is shown in FIG. 6.

Figure 6:
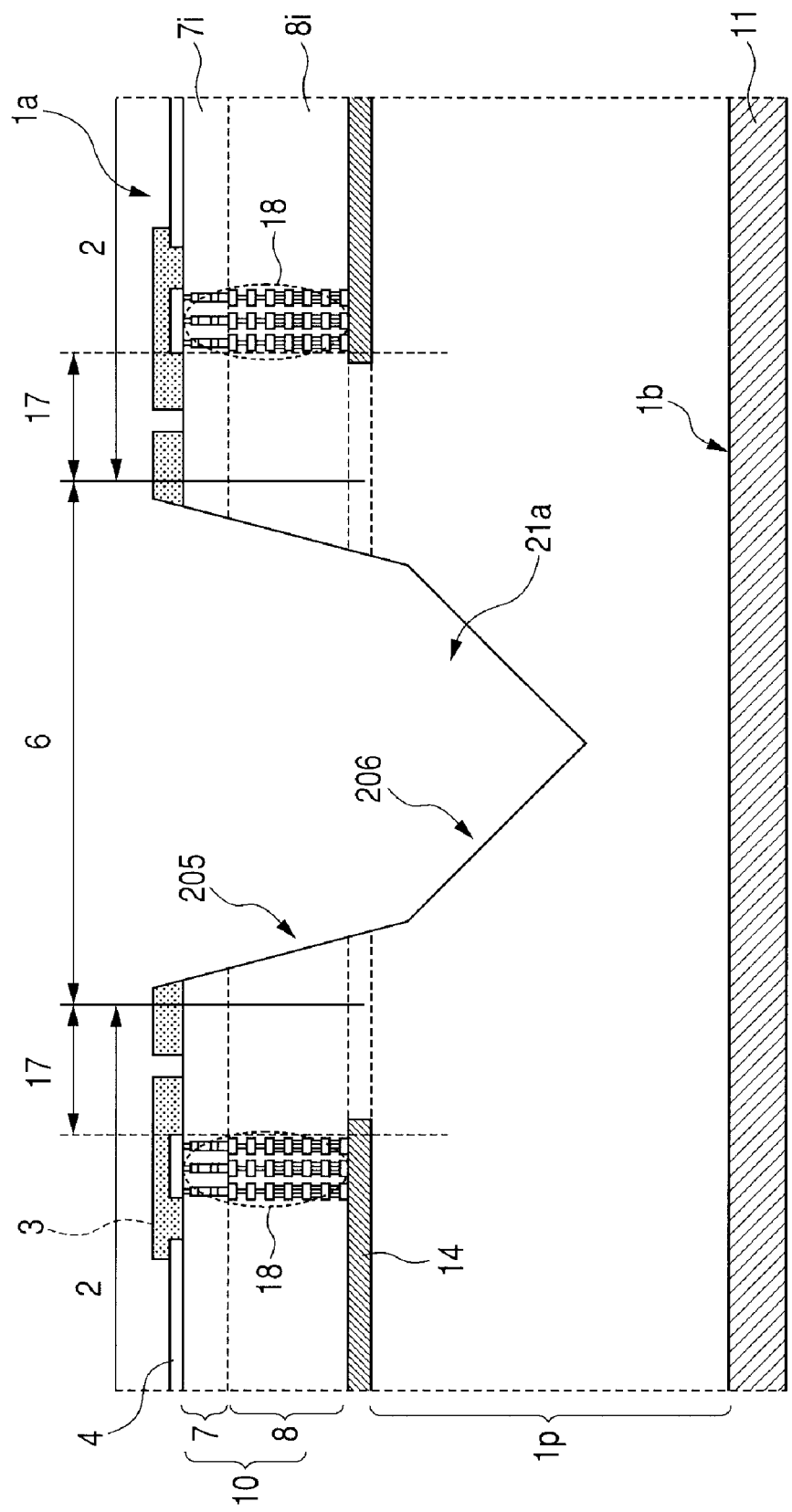
FIG. 6 is an enlarged cross-sectional view (after dicing with the first blade) of the broken line portion R2 (the periphery of the chips and the region between the chips) of FIG. 4(c)

As illustrated in FIG. 6, in accordance with the two-step taper shape, the dicing groove 21a has a steep first chip end-face 205 (side face of groove), a relatively gentle third chip end-face 206 (bottom face of the groove) and the like.

A cutting step which is the second step of dicing with the straight blade 51b will next be described referring to FIGS. 7(a) to 7(c). As illustrated in FIGS. 7(a) to 7(c), the wafer is cut along the dicing groove 21a in each of X and Y directions (cutting as a second step of the two-step cutting), the dicing groove 21a on the side of the device surface 1a of the wafer 1 is extended to the inside of the dicing tape 11 attached to the back surface 1b. The cross-section will next be described specifically based on FIG. 8. As illustrated in FIG. 8, the thickness T3 of the straight blade 51b (the distance between third boundary points S and S', that is, a third boundary point width) is smaller than the second boundary point width T2 of the tapered dicing blade 51a so that the straight blade 51b cuts only the third chip end-face 206 of the dicing groove 21a. No minute device structural is present in this area so that dicing can be performed without damaging the device. In addition, this portion is made of a silicon single crystal and is therefore relatively hard and tough so that occurrence frequency of chipping is low. In this example, the straight blade 51b has, as a tip portion thereof, a flat tip face (tip face) 110. The tip portion does not essentially have a flat surface but such a flat surface can be made easily. Accordingly, it may have a similar shape to that of the tapered dicing blade 51a (refer to FIGS. 21(a) to 21(e)). What is important is a relationship in the relative thickness between these two blades as described above. The cutting result with the straight blade 51b is shown in FIG. 9.

Figure 9:
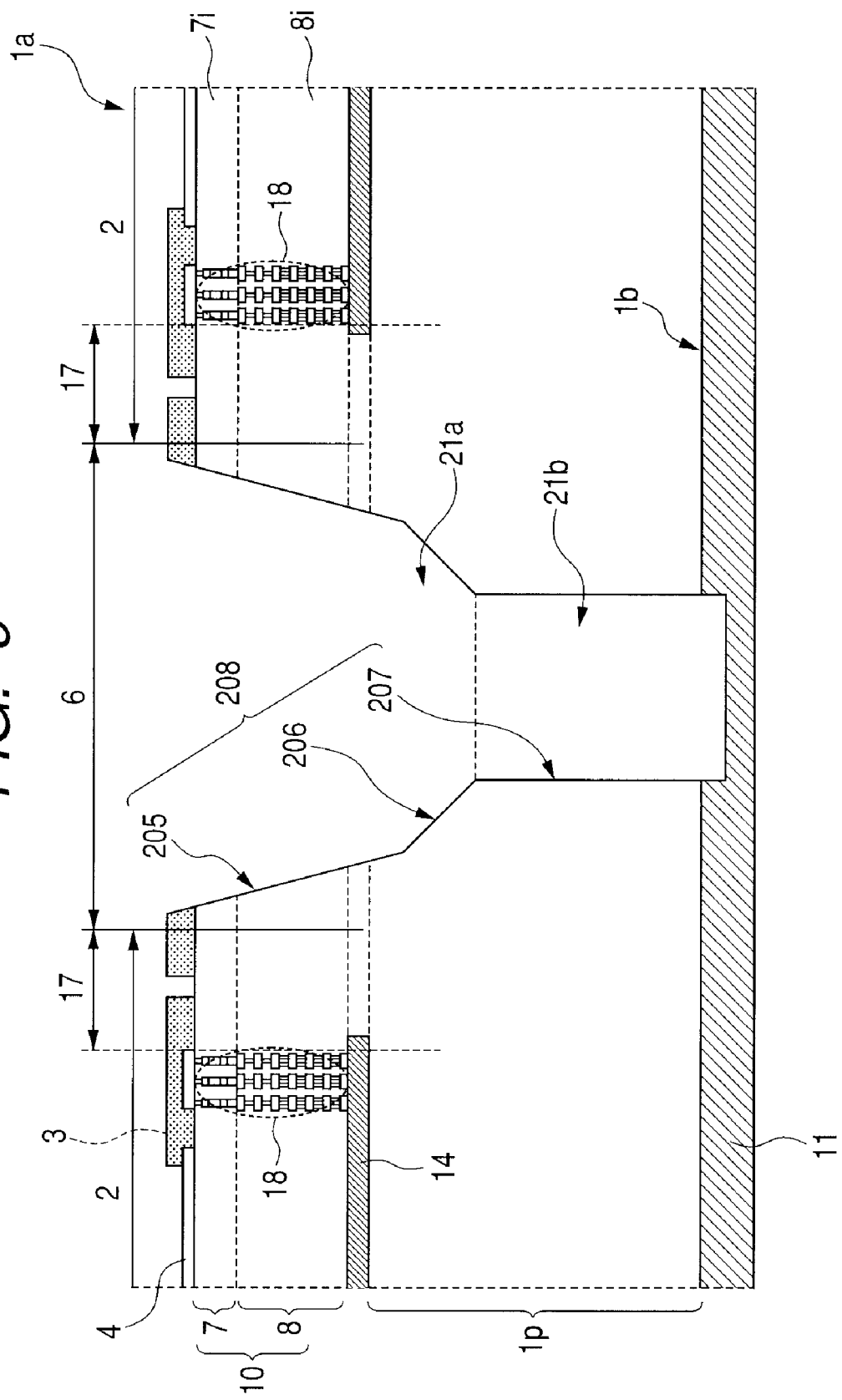
FIG. 9 is an enlarged cross-sectional view (after dicing with the second blade) of the periphery of the chips and the region between the chips illustrated in FIG. 7(c)

As illustrated in FIG. 9, a second dicing groove 21b is newly formed and as a result, a perpendicular face 207 (second chip end-face) of a chip 2 is formed. A chip side-wall portion 209 is comprised of, in addition to it, a steep first chip end-face 205 (groove side face), a relatively gentle third chip end-surface 206 (groove bottom face), and the like.

Figure 10:
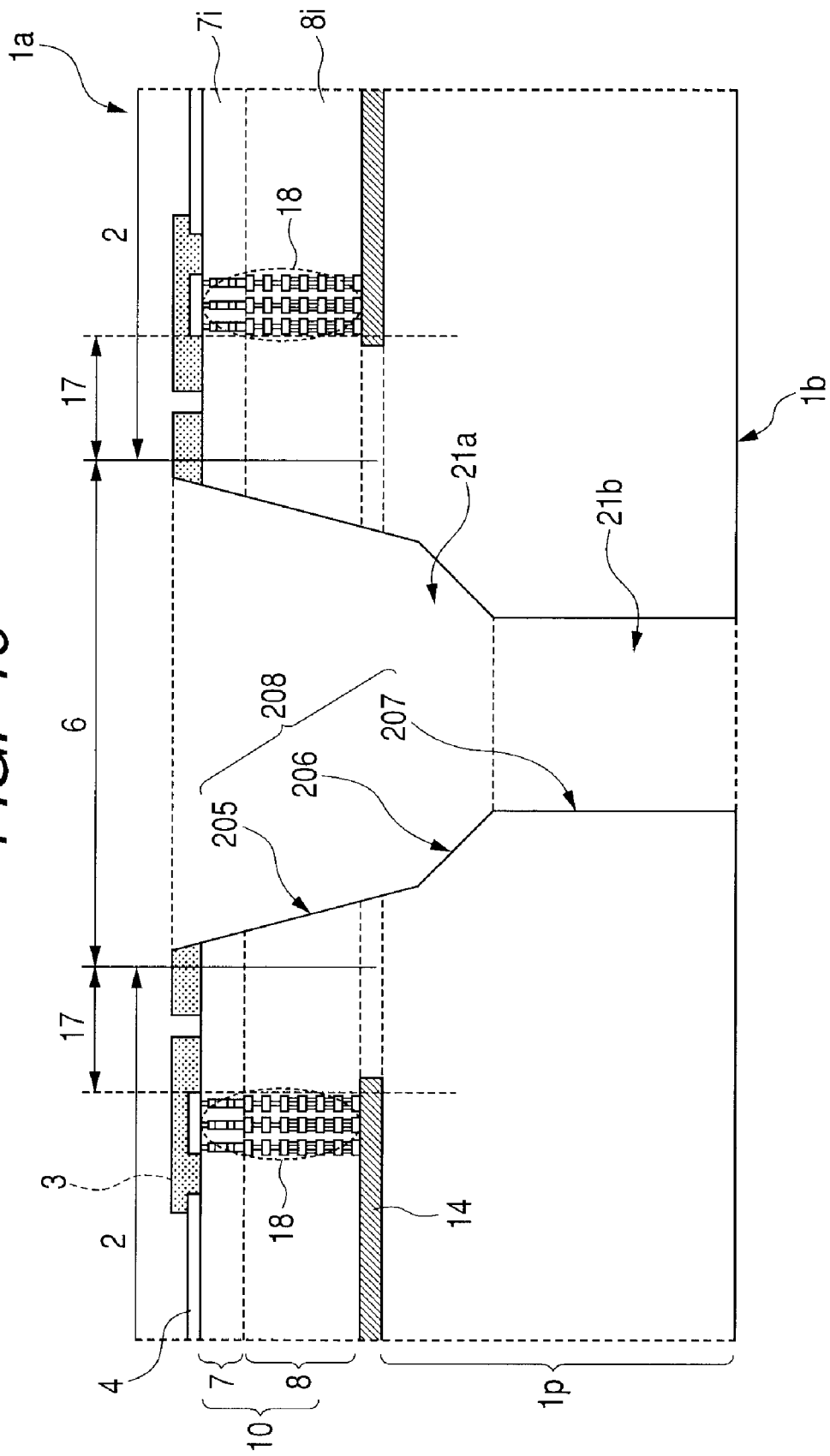
FIG. 10 is an enlarged cross-sectional view (after peeling from the dicing tape) of the periphery of the chips and the region between the chips illustrated in FIG. 7(c)

As illustrated in FIG. 10, the dicing tape 11 is then peeled, whereby a large number of independent chips 2 appear. In practice, a chip 2 is picked up from the dicing tape 11 and die bonding is then performed as described in the following section 3.

3. Description on the Assembly Process and the Like in the Manufacturing Method of a Semiconductor Device According to Each Embodiment of the Invention (Mainly, from FIG. 11(a) to FIG. 16).

In this section, one example of an assembly process following the dicing step described in each section will be described.

Figure 11A:
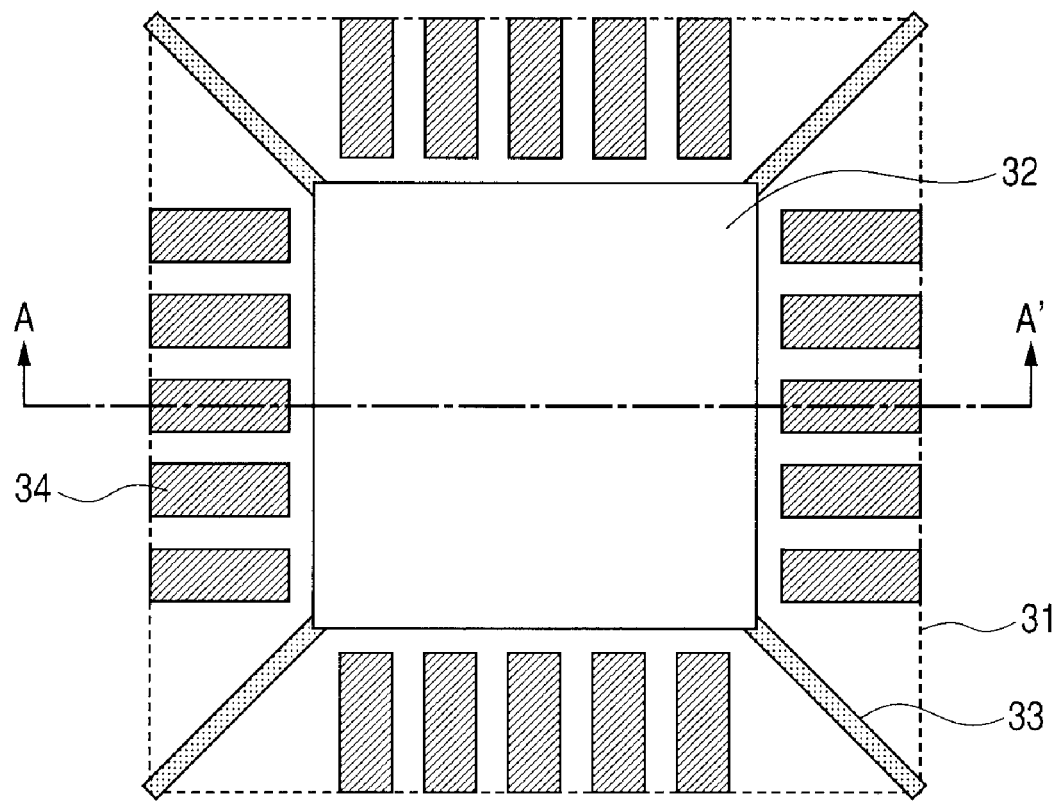
Figure 11B:

First, a chip mounting substrate 31 (only a unit device region is shown) as illustrated in FIGS. 11(a) and 11(b) (FIG. 11(a) illustrates an upper surface, while FIG. 11(b) illustrates an A-A' cross-section). This drawing shows an example of a lead frame, but an organic multilevel interconnect substrate or another interconnect substrate may be used instead. As illustrated in FIGS. 11(a) and 11(b), the chip mounting substrate 31 has, at the center portion thereof, a die pad portion 32 (chip mounting portion). The die pad portion 32 is fixed in four directions with suspending leads 33. A number of external lead portions 34 (joining members) extend at the outer periphery of the die pad portion 32.

Figure 12A:
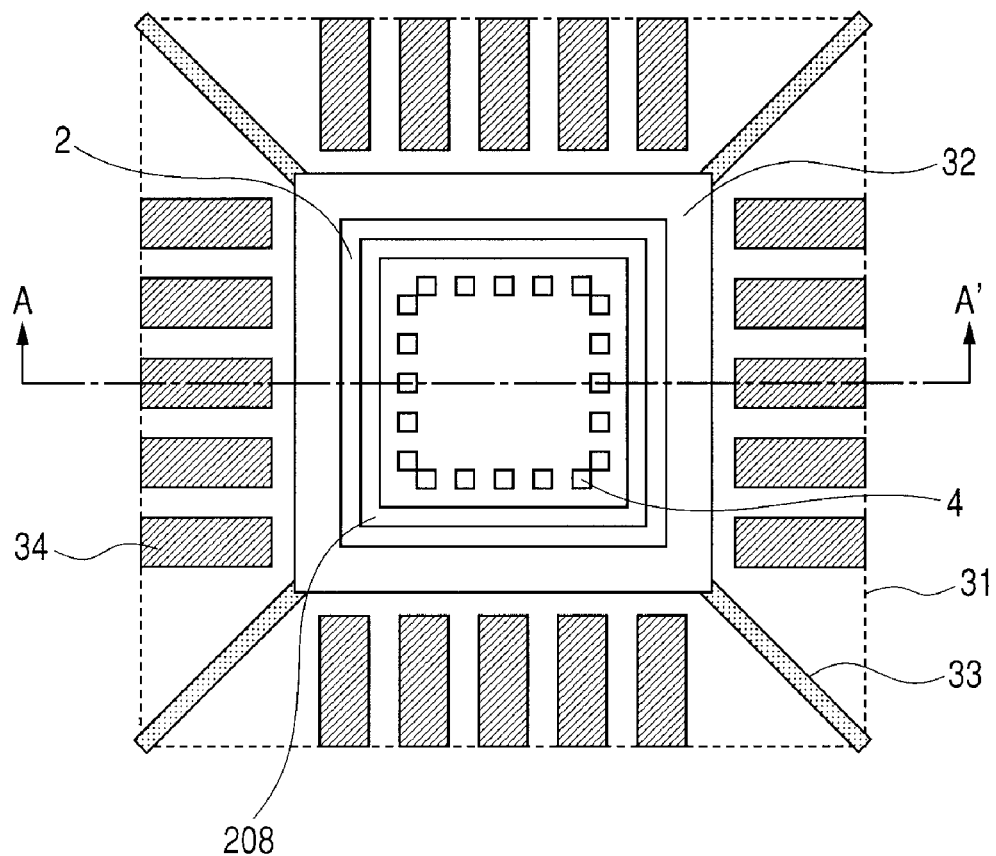
Figure 12B:
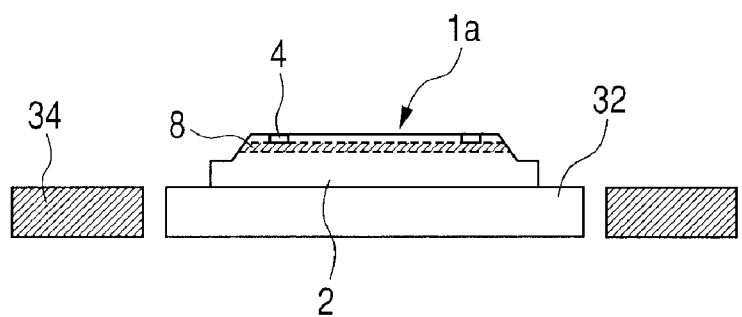

Then, the chip 2 under the state as illustrated in FIG. 9 is picked up and as illustrated in FIGS. 12(a) and 12(b), it is die-bonded onto the die pad portion 32. Then, as illustrated in FIGS. 13(a) and 13(b), the external lead portions 34 and the electrode pads 4 on the upper surface of the chip 2 are subjected to, for example, ball-wedge bonding with a bonding wire 35 (conductive member).

Figure 13A:
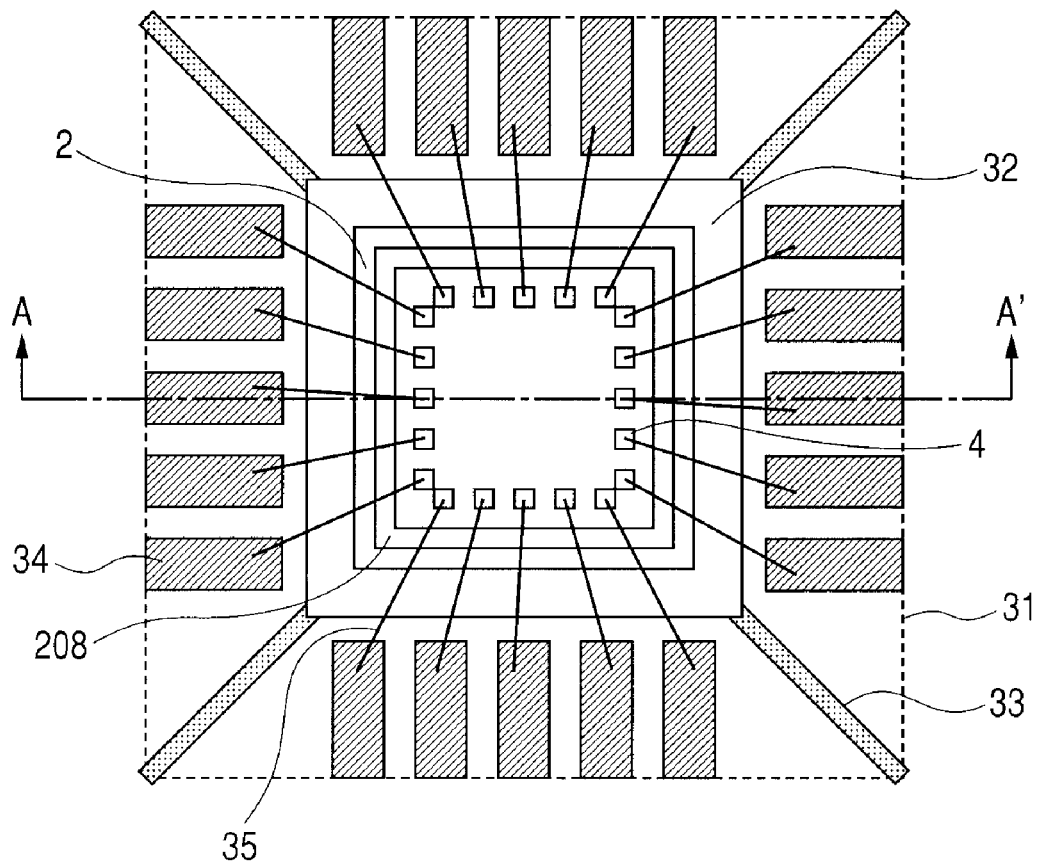
Figure 13B:
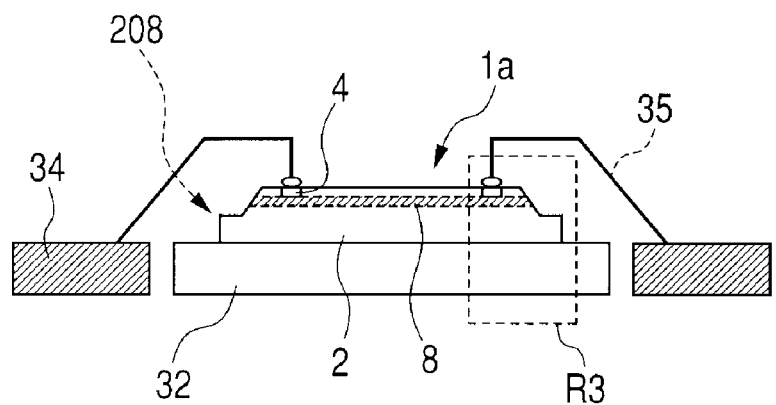
Figure 14:
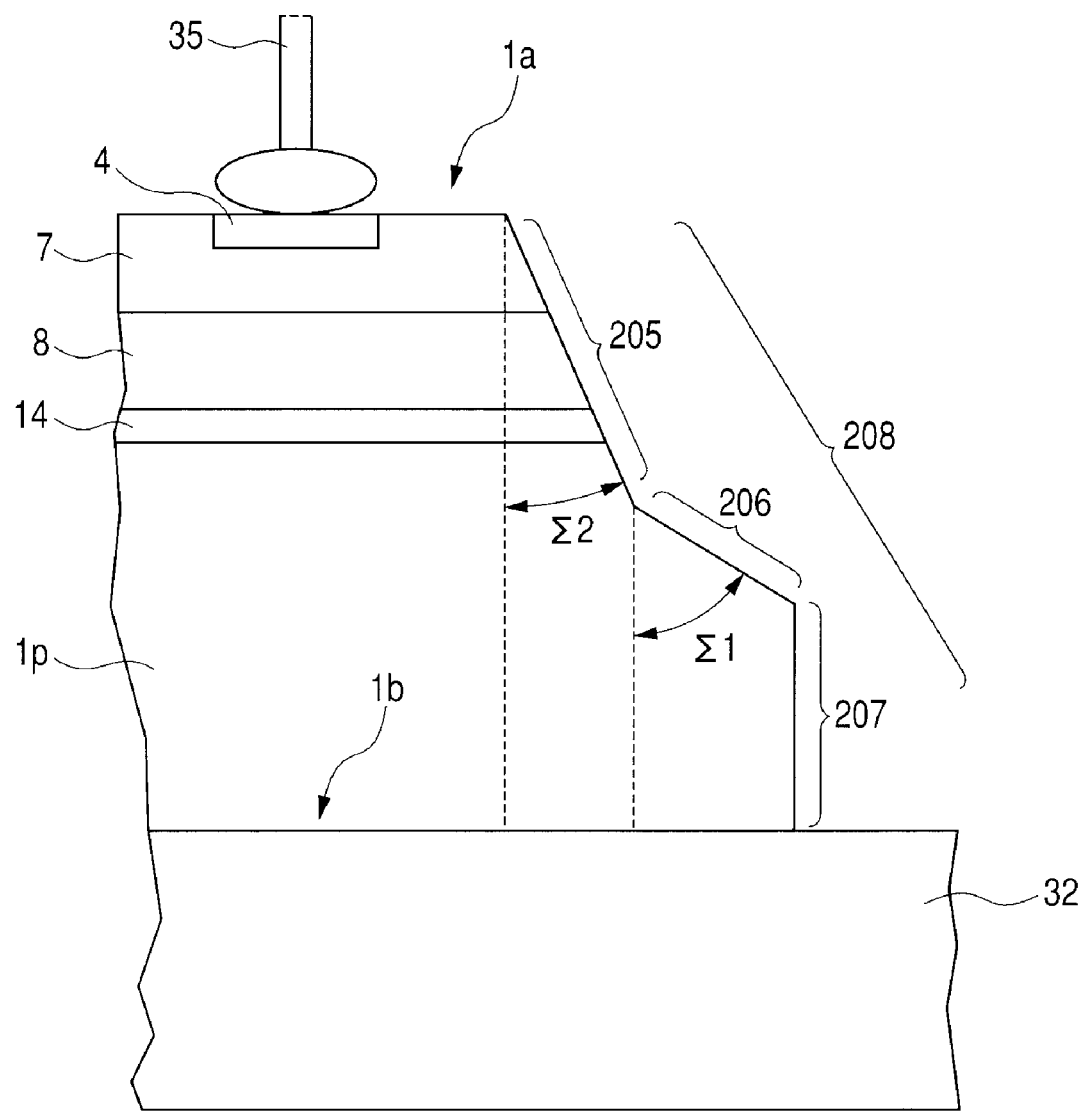
FIG. 14 is a device enlarged cross-sectional view corresponding to the broken line portion of FIG. 13(b)

FIG. 14 is an enlarged view of the chip end portion R3 of FIGS. 13(a) and 13(b). As illustrated in FIG. 14, the first chip end-face 205 is inclined at a second end-face angle of inclination S2 with respect to the perpendicular face 207. A third chip end-face 206 is inclined at a first end-face angle of inclination S1 greater than the second end-face angle of inclination S2 with respect to the perpendicular face 207.

Figure 16:
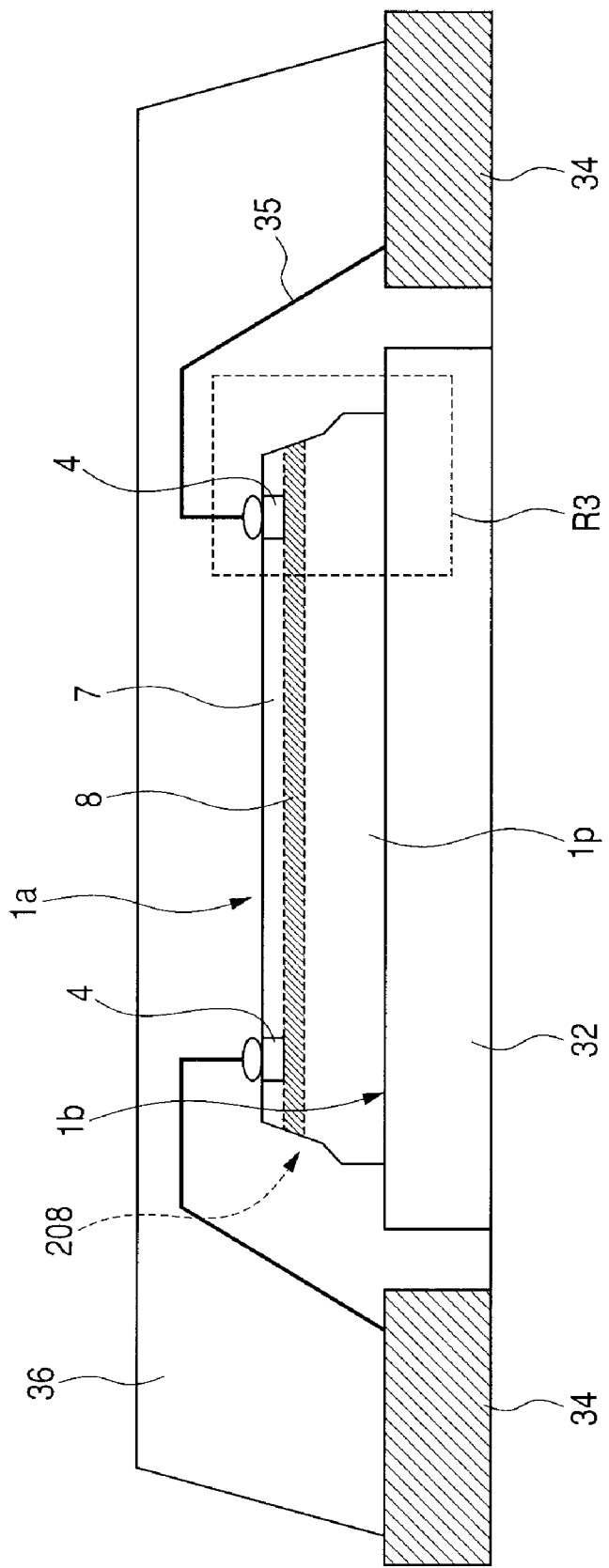
FIG. 16 is a cross-sectional view of a unit device taken along line A-A' of FIG. 15.

Then, as illustrated in FIGS. 15(a) and 15(b), the lead frames 31 are separated from each other and each becomes a resin sealed portion 36 (individual device). The final device has a cross-sectional shape as illustrated in FIG. 16.

Figure 17:
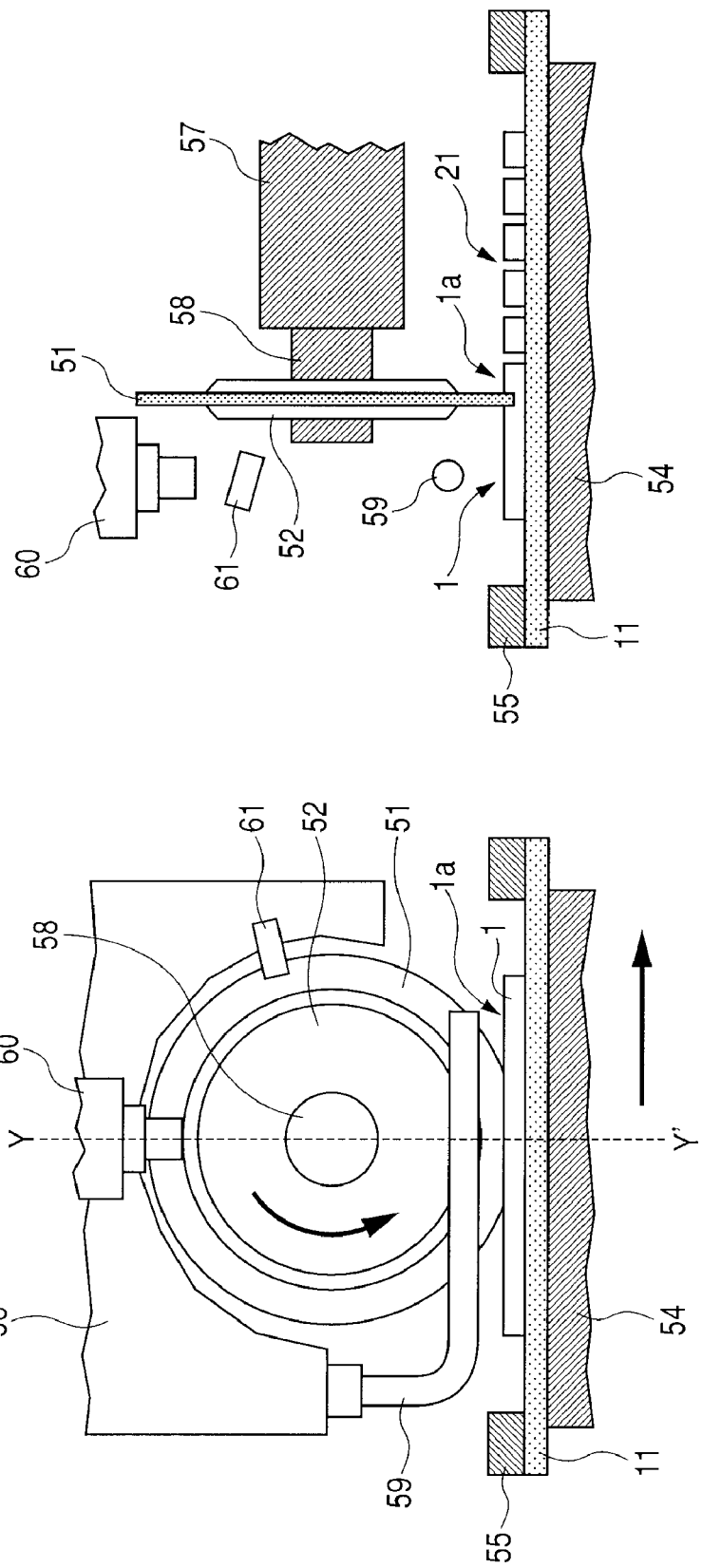

4. Description on a Dicing Apparatus and the Like to be Used in the Manufacturing Method of a Semiconductor Device According to Each Embodiment of the Invention (Mainly FIG. 17(a) to FIG. 18).

In this section, a dicing apparatus and the like to be used in common in each example will be described. As illustrated in FIGS. 17(a) and 17(b), the dicing apparatus has a suction table 54 (wafer stage) and the wafer 1 adhered and fixed onto a ring flame 55 via the dicing tape 11 is vacuum sucked onto the suction table. Under such a state, the dicing blade 51 is attached to, via a blade holding portion 52, an end portion 58 of a spindle 57 supported by a spindle holding portion 56 and it is rotated at high speed to effect cutting. At this time, the stage 54 usually moves in a horizontal direction to carry out cutting to form the dicing groove 21. During cutting, pure water or cooling liquid for cooling or washing is supplied from a cooling water supply arm-like nozzle 59, a pure water spray 60, a pure water shower 61, or the like. In the invention, the term "cross-section in the radial direction of a blade" (or cross-sectional shape of the blade, simply) means a Y-Y' cross-section of FIG. 17(a) unless otherwise specifically indicated.

Figure 18:
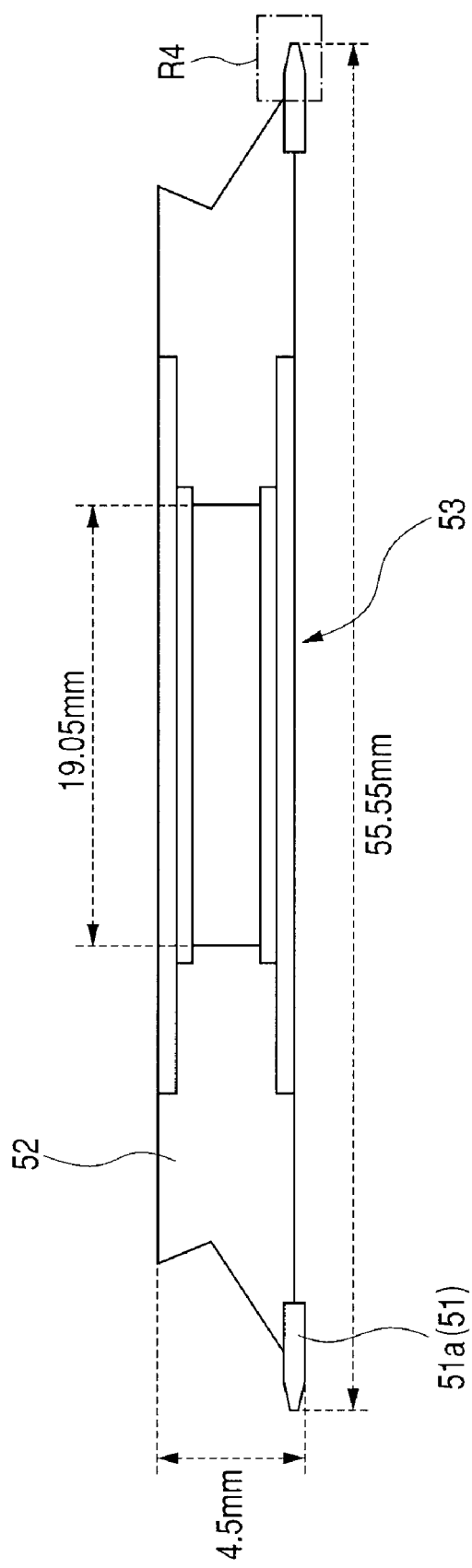
FIG. 18 is a specific cross-sectional structure view of the rotary blade and periphery thereof taken along line Y-Y' of FIG. 17(a)

The blade illustrated in FIGS. 17(a) and 17(b) is an assembly type. A hub type blade popularly used now is illustrated in FIG. 18. In this hub type blade, a blade holding portion 52 having at the center thereof a spindle attaching portion 53 and the dicing blade 51 are integrated into one. In this case, the dicing blade 51 itself is not a circular disk shape but a circular ring shape.

Each member has a standardized size, which is shown in this drawing. It is needless to say that the member with another size is also usable.

5. Description on a Dicing Process (Modification Example 1: "Tapered Thin Blade System") and the Like in the Manufacturing Method of a Semiconductor Device According to Another Embodiment of the Invention (Mainly FIG. 19).

Figure 19:
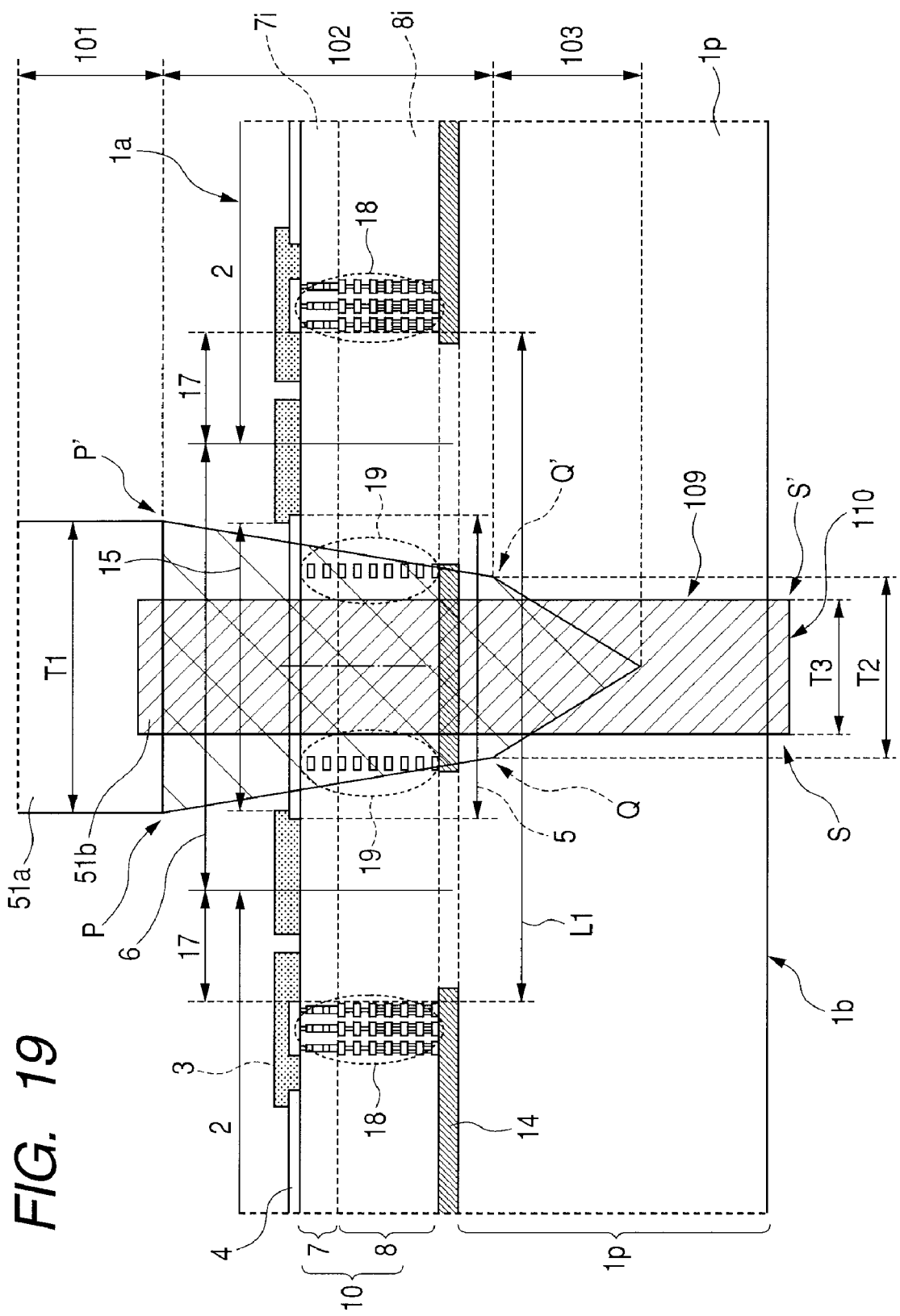
FIG. 19 illustrates a modification example 1 (example of using a first blade having a small blade thickness) of the dicing processes ("fundamental dicing processes") illustrated in FIGS. 1 to 10.
Figure 23A:
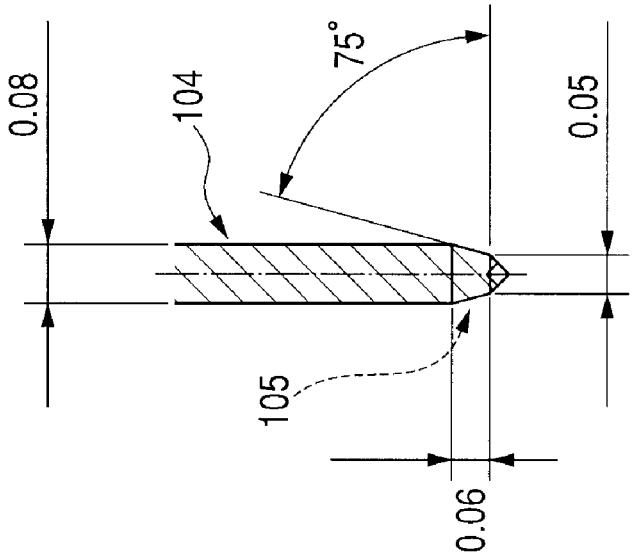
FIGS. 23(a) and 23(b) are cross-sectional views illustrating the particularly preferred range of the maximum size and maximum angle of inclination and the particularly preferred range of the minimum size and minimum angle of inclination of the blade cross-sectional structure illustrated in FIG. 21(a), respectively.
Figure 23B:
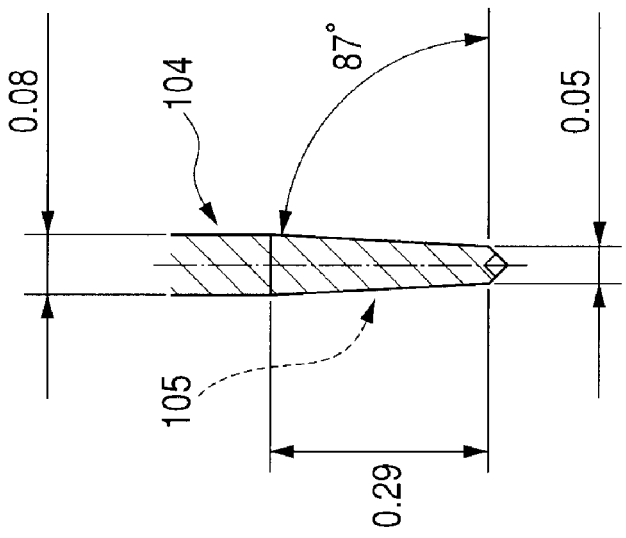

In this example, only some of the TEG test pads 5 (test pads or electrode pads) are cut and removed in the first step of Section 2. FIG. 19 is a cross-sectional view in which FIG. 5 and FIG. 8 of Section 2 are overlapped with each other. In this example, contrary to FIG. 5, the non-device region 6 (scribe region or dicing region) is greater than the thickness T1 (first boundary point width) of the flat inner ring portion of the tapered dicing blade.

In the conventional dicing step, almost all the TEG test pads 5 are removed in order to prevent leakage of test know-how or prevent generation of dust in later steps. This, however, tends to expand the scribe region. Expansion of the scribe region leads to a drastic decrease in the available number so that it must be avoided as much as possible. In SIP (system in package) type products, the size of the scribe region is often set to a relatively small value in advance for the convenience of the design. Further, it is difficult to narrow the chipping margin in consideration of its intended use. In order to fulfill the above-described object, it is the best way to remove all the TEG test pads 5 as in another example of the invention, but if not possible, it is effective to decrease the blade thickness of the first-step blade as in the present example.

When only the main TEG test pads 5 are removed as in the present embodiment, it is possible to decrease the width of the scribe region because they can be removed with a blade with a small width (blade for first cutting). Since the main TEG test pads 5 are removed, even such a system is effective for preventing leakage of the test know-how and, in a later step, suppressing generation of dust.

6. Description on a Dicing Process (Modification Example 2: "Polyimide Coating System") and the Like in the Manufacturing Method of a Semiconductor Device According to a Further Embodiment of the Invention (Mainly FIG. 20).

This example is a modification example of the device structure described in Section 2 and Section 5. In a device having a redistribution structure such as wafer level package or a device having a bump electrode, it is necessary to form a pattern of an upper final passivation film 12 (for example, a photosensitive polyimide type organic resin film) over a lower final passivation film 3 and then form a plated layer (metal layer) by electrolytic plating or electroless plating over the electrode pads 4 in the product region (electroless gold plating or the like tends to be used). In this plating, however, a plating layer is unnecessarily formed even over the electrode pads 5 in the scribe region or the electrode pads 5 are corroded with an acid used for the pretreatment. In order to prevent such problems, the electrode pads 5 of the scribe region are often covered with an organic protecting film such as polyimide film, which is formed in the same layer as the upper final passivation film 12. When such an organic resin film and a hard silicon member are mechanically diced at the same time, however, an excessive load may be applied to the rotating blade, leading to frequent occurrence of chipping (also in the absence of the low-k interconnect layer 8).

In such a case, the dicing method as described in Section 1 or Section 5 is effective. As described referring to FIGS. 26(a) and 26(b), even if slight misalignment of the blade occurs due to an excessive load, its influence on the side wall of the dicing groove can be suppressed because there is a space between the side wall of the dicing groove and the side face of the blade in the vicinity of the escape point where chipping is likely to occur.

7. Description on the Cross-Sectional Structure of the Dicing Blade (Tapered Dicing Blade) Usable in a Dicing Apparatus to be Used in the Manufacturing Method of a Semiconductor Device According to Each Embodiment of the Invention (Mainly, from FIG. 21(a) to FIG. 24(b)).

In the above sections, the tapered dicing blade having a two-step taper to be used for the first step was mainly described in detail. In this section, on the other hand, variations of the cross-sectional shape of the blade circumferential portion R4 (FIG. 18) will be described specifically.

As illustrated in FIGS. 21(a) to 21(e), the cross-sectional shape of the blade circumferential portion R4 (FIG. 18) in each embodiment of the invention can be roughly classified into five types morphologically. The blade shown in FIG. 21(a) has a fundamental cross-sectional shape described in Section 2, in which the flat inner ring portion 101 (corresponding to an inner ring portion side-face 104 or a first side face) has thereunder an outer ring portion 102 of a trapezoidal shape (corresponding to the outer ring side-face 105 or the second side face) and has, under the outer ring portion, an outer edge portion 103 of an isosceles triangle (corresponding to an outer edge portion side face 106 or third side face). The blade illustrated in FIG. 21(b) (tip-omitted type) has a similar cross-sectional shape to that of the blade of FIG. 21(a) except that the outer edge portion 103 of an isosceles triangle is replaced with a flat tip face 108. The other blades have each a similar cross-sectional shape to the fundamental one except that the outer edge portion 103 of an isosceles triangle is modified. FIG. 21 (c) is a cross-sectional shape having a gentle curve instead of the isosceles triangle (curved tip type); FIG. 21(d) is a cross-sectional shape in which a portion near the apex of the isosceles triangle is linearly beveled (outer-end beveled portion 107); and FIG. 21(*e*) is a cross-sectional shape in which a portion near the isosceles triangle is spherically beveled (outer-end beveled portion 107).

Figure 24A:
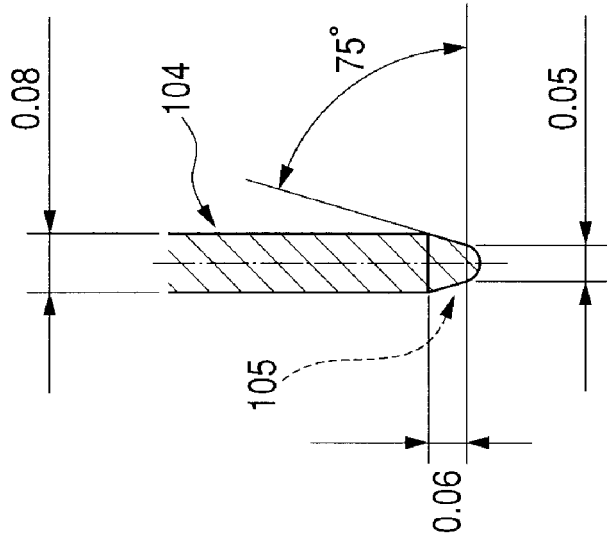
FIGS. 24(a) and 24(b) are cross-sectional views illustrating the particularly preferred range of the maximum size and maximum angle of inclination and the particularly preferred range of the minimum size and minimum angle of inclination of the blade cross-sectional structure illustrated in FIG. 21(c), respectively.
Figure 24B:
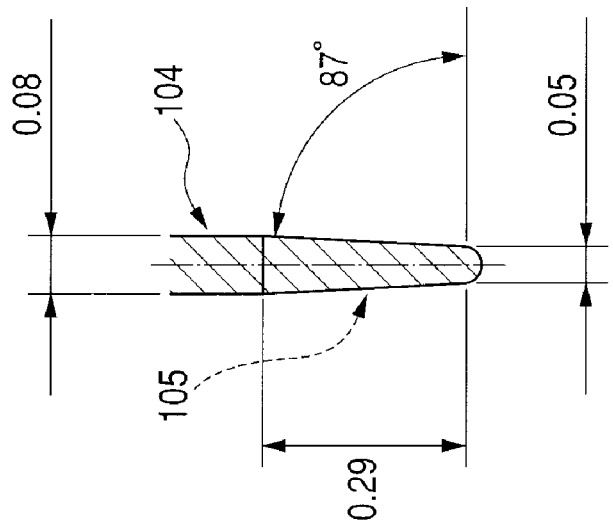

With respect to a trial blade of each embodiment made and evaluated by the present inventors under various conditions, preferred ranges of the size and angle of the cross-sectional shape of the blade circumferential portion R4 will next be described referring to from FIG. 22(*a*) to FIG. 24(*b*). In these drawings, the size is expressed in unit of mm, while the angle is expressed in unit of °. In these drawings, each drawing (a) illustrates the optimum maximum complementary angle of inclination (maximum complementary angle of inclination practically usable under ordinary conditions) and optimum maximum width of outer ring portion. Each drawing (b) illustrates the optimum minimum complementary angle of inclination (minimum complementary angle of inclination practically usable under ordinary conditions) and optimum minimum width of outer ring portion. The inner angle at the apex in FIGS. 23(*a*) and 23(*b*) is preferably from 50° to 180° (equal to that of FIGS. 22(*a*) and 22(*b*)). It is therefore possible to give an example of from 75° to 87° as a practical range of the complementary angle of inclination of the outer ring portion side-face under the ordinary conditions. This means from 3° to 15° in terms of the angle Θ2 of inclination of the outer ring portion side-face (first side-face angle of inclination). Under the conditions permitting sufficient mechanical precision, it is possible to give an example of from 70° to 88° as a practical range of the complementary angle Θ2 of inclination of the outer ring portion side-face under the ordinary conditions. This means from 2° to 20° in terms of the angle Θ2 of inclination of the outer ring portion side-face (first side-face angle of inclination). Under conditions requiring reliability especially, it is possible to give an example of from 80° to 86° as a practical range of the complementary angle θ2 of inclination of the outer ring portion side-face (first side-face angle of inclination) under the ordinary conditions. This means from 4° to 10° in terms of the angle Θ2 of inclination of the outer ring portion side-face.

8. Summary

The inventions made by the present inventors were described in detail. It should be borne in mind, however, that the present invention is not limited to it but can be changed without departing from the scope of the invention.

For example, in the above embodiments, specific description was made on the premise of a conventional dicing step to be performed after back grinding. The present invention is not limited to it however and it is needless to say that the invention can be applied to DBG (dicing before grinding) in which dicing is performed prior to back grinding. In this case, not full cut but half cut is performed by second cutting.

In the above embodiments, the invention was applied to an interconnect structure using aluminum-based conventional interconnects or copper-based damascene interconnects. It is needless to say that the invention can be applied not only to them but also an interconnect structure using silver-based damascene interconnects or another type.

The invention claimed is:

1. A manufacturing method of a semiconductor device comprising the steps of:
   (a) preparing a semiconductor wafer having a main surface, a plurality of device regions formed over the main surface, a dicing region formed between the device regions, and a back surface opposed to the main surface;
   (b) in the dicing region of the semiconductor wafer, inserting a first dicing blade into the semiconductor wafer from the main surface side to the back surface side of the semiconductor wafer, and forming a dicing groove in the main surface of the semiconductor wafer by causing the first dicing blade to run along the dicing region;
   (c) after the step (b), inserting a second dicing blade into the dicing groove from the main surface side of the semiconductor wafer, and separating the semiconductor wafer into a plurality of semiconductor chips by causing the second dicing blade to run along the dicing region;
   (d) disposing the semiconductor chips obtained by performing the step (c) over a chip mounting portion of a chip mounting substrate;
   (e) after the step (d), electrically coupling the semiconductor chips to the chip mounting substrate, respectively; and
   (f) sealing the semiconductor chip with a resin,
   wherein the semiconductor wafer has a base material layer, a semiconductor element layer formed over the base material layer, a first interconnect layer formed over the semiconductor element layer, and a second interconnect layer formed over the first interconnect layer,
   wherein the dielectric constant of a first insulating layer placed in the first interconnect layer is lower than the dielectric constant of each of a premetal insulating layer formed in the semiconductor element layer and a second insulating layer placed in the second interconnect layer,
   wherein the first dicing blade used in the step (b) has a circular planar shape,
   wherein the cross-sectional shape of the first dicing blade at the circumferential portion thereof has a first side face, a second side face having a first side-face angle of inclination relative to the first side face, and a third side face having relative to the first side face a second side-face angle of inclination greater than the first side-face angle of inclination,
   wherein the width between second boundary points of the second side face and the third side face is smaller than the width between first boundary points of the first side face and the second side face, and
   wherein in the step (b), the first dicing blade is inserted into the semiconductor wafer such that the second boundary points of the first dicing blade reach the base material layer.

2. The manufacturing method of a semiconductor device according to claim 1,
   wherein the planar shape of the second dicing blade to be used in the step (c) which intersects with a thickness direction of the second dicing blade is circular,
   wherein the cross-sectional shape of the second dicing blade at the circumference thereof has a fourth side face and a tip face,
   wherein the width between third boundary points of the fourth side face and the tip face is smaller than the width between portions of the second side faces of the first dicing blade to be brought into contact with the semiconductor element layer, and
   wherein in the step (c), the second dicing blade is inserted into the dicing groove so that a portion of the second dicing blade reaches a dicing tape attached to the back surface of the semiconductor wafer before the step (b).

3. The manufacturing method of a semiconductor device according to claim 2,
   wherein the device regions each has a rectangular planar shape,
   wherein a plurality of electrode pads are formed in each of the device regions along sides thereof, and
   wherein in each of the device regions, a seal ring is formed between the electrode pads and the sides and along the sides.

4. The manufacturing method of a semiconductor device according to claim 3,
wherein an insulating film is formed in the dicing region to cover test pads, and
wherein after the step (a) but before the step (b), a metal layer is formed over the electrode pads formed in each of the device regions.

5. The manufacturing method of a semiconductor device according to claim 4,
wherein the metal layer is formed by electroless plating.

6. The manufacturing method of a semiconductor device according to claim 2,
wherein the test pads formed in the dicing region of the main surface of the semiconductor wafer are electrically coupled to the semiconductor element layer via the first interconnect layer and the second interconnect layer.

7. The manufacturing method of a semiconductor device according to claim 6,
wherein in the step (b), all the test pads are removed with the first dicing blade.

8. The manufacturing method of a semiconductor device according to claim 6,
wherein in the step (b), some of the test pads are removed with the first dicing blade.

9. A manufacturing method of a semiconductor device comprising the steps of:
(a) preparing a semiconductor wafer having a main surface, a plurality of device regions formed over the main surface, a dicing region formed between the device regions, and a back surface opposed to the main surface;
(b) in the dicing region of the semiconductor wafer, inserting a first dicing blade into the semiconductor wafer from the main surface side to the back surface side of the semiconductor wafer, and forming a dicing groove in the main surface of the semiconductor wafer by causing the first dicing blade to run along the dicing region;
(c) after the step (b), inserting a second dicing blade into the dicing groove from the main surface side of the semiconductor wafer, and separating the semiconductor wafer into a plurality of semiconductor chips by causing the second dicing blade to run along the dicing region;
(d) disposing the semiconductor chips obtained by performing the step (c) over a chip mounting portion of a chip mounting substrate;
(e) after the step (d), electrically coupling the semiconductor chips to the chip mounting substrate, respectively; and
(f) sealing the semiconductor chip with a resin,
wherein the semiconductor wafer has a base material layer, a semiconductor element layer formed over the base material layer, a first interconnect layer formed over the semiconductor element layer, and a second interconnect layer formed over the first interconnect layer,
wherein the dielectric constant of a first insulating layer placed in the first interconnect layer is lower than the dielectric constant of each of a premetal insulating layer formed in the semiconductor element layer and a second insulating layer placed in the second interconnect layer,
wherein the first dicing blade used in the step (b) has a circular planar shape,
wherein the cross-sectional shape of the first dicing blade at the circumferential portion thereof has a first face and a second face having a first side-face angle of inclination relative to the first face, and
wherein in the step (b), the first dicing blade is caused to run along the dicing region such that the first interconnect layer is brought into contact with the second face of the first dicing blade.

10. The manufacturing method of a semiconductor device according to claim 9,
wherein the planar shape of the second dicing blade to be used in the step (c) which intersects with a thickness direction of the second dicing blade is circular,
wherein the cross-sectional shape of the second dicing blade at the circumference portion thereof has a fourth face and a tip face,
wherein the width between third boundary points of the fourth face and the tip face is smaller than the width between portions of the second faces of the first dicing blade to be brought into contact with the semiconductor element layer, and
wherein in the step (c), the second dicing blade is inserted into the dicing groove so that a portion of the second dicing blade reaches a dicing tape attached to the back surface of the semiconductor wafer before the step (b).

11. The manufacturing method of a semiconductor device according to claim 10,
wherein each of the device regions has a rectangular planar shape,
wherein a plurality of electrode pads are formed in each of the device regions along sides thereof, and
wherein in each of the device regions, a seal ring is formed between the electrode pads and the sides and along the sides.

12. The manufacturing method of a semiconductor device according to claim 11,
wherein an insulating film is formed in the dicing region to cover test pads, and
wherein after the step (a) but before the step (b), a metal layer is formed over the electrode pads formed in each of the device regions.

13. The manufacturing method of a semiconductor device according to claim 12,
wherein the metal layer is formed by electroless plating.

14. The manufacturing method of a semiconductor device according to claim 10,
wherein the test pads formed in the dicing region of the main surface of the semiconductor wafer are electrically coupled to the semiconductor element layer via the first interconnect layer and the second interconnect layer.

15. The manufacturing method of a semiconductor device according to claim 14,
wherein in the step (b), all the test pads are removed with the first dicing blade.

16. The manufacturing method of a semiconductor device according to claim 14,
wherein in the step (b), some of the test pads are removed with the first dicing blade.

* * * * *